US012575045B2

(12) United States Patent
Jin et al.

(10) Patent No.: US 12,575,045 B2
(45) Date of Patent: Mar. 10, 2026

(54) DISPLAY DEVICE

(71) Applicant: Samsung Display Co., Ltd., Yongin-si (KR)

(72) Inventors: Byoung Jin Jin, Yongin-si (KR); Joon-Ik Lee, Yongin-si (KR); Mansoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 385 days.

(21) Appl. No.: 18/320,289

(22) Filed: May 19, 2023

(65) Prior Publication Data

US 2024/0107692 A1 Mar. 28, 2024

(30) Foreign Application Priority Data

Sep. 23, 2022 (KR) ........................ 10-2022-0120738

(51) Int. Cl.
*G06F 1/16* (2006.01)
*H05K 5/00* (2025.01)
*H05K 5/02* (2006.01)

(52) U.S. Cl.
CPC ................................. *H05K 5/0226* (2013.01)

(58) Field of Classification Search
CPC ... H05K 5/0226; G06F 1/1624; G06F 1/1652; G06F 1/1641; H04M 1/0237; H04M 1/0268; G09F 9/301; H10K 50/84; H10K 2102/311
See application file for complete search history.

(56) References Cited

U.S. PATENT DOCUMENTS

| | | | | |
|---|---|---|---|---|
| 10,194,543 | B2 * | 1/2019 | Seo | G09F 9/301 |
| 10,747,269 | B1 * | 8/2020 | Choi | G06F 1/1652 |
| 10,972,592 | B2 | 4/2021 | Song et al. | |
| 11,165,897 | B2 | 11/2021 | Song et al. | |
| 11,514,823 | B2 * | 11/2022 | Shin | H04M 1/0268 |
| 11,563,835 | B2 * | 1/2023 | Lim | G06F 1/1624 |
| 11,644,867 | B2 * | 5/2023 | Ahn | G06F 1/1624 |
| | | | | 361/679.27 |
| 11,800,661 | B2 * | 10/2023 | Liu | H04M 1/0237 |
| 11,800,663 | B2 * | 10/2023 | Li | G06F 1/1624 |
| 12,016,142 | B2 * | 6/2024 | Jiang | G09F 9/301 |
| 12,206,810 | B2 * | 1/2025 | Kang | H04M 1/0237 |
| 2011/0176260 | A1 * | 7/2011 | Walters | H04M 1/0268 |
| | | | | 361/679.01 |

(Continued)

FOREIGN PATENT DOCUMENTS

| | | |
|---|---|---|
| KR | 10-0616654 | 8/2006 |
| KR | 10-0782446 | 12/2007 |

(Continued)

*Primary Examiner* — Rockshana D Chowdhury
(74) *Attorney, Agent, or Firm* — Lerner David LLP

(57) ABSTRACT

A display device includes a display module, a support plate disposed under the display module and including a plate and a plurality of support bars arranged in a first direction with the plate, a moving plate disposed under the plate and coupled to the support bars, an expansion module disposed between the plate and the moving plate and movable in the first direction, a main case disposed under the moving plate and accommodating the moving plate and the expansion module, and a sliding hinge disposed between the main case and the moving plate.

19 Claims, 32 Drawing Sheets

(56)        References Cited

U.S. PATENT DOCUMENTS

| | | | |
|---|---|---|---|
| 2014/0211399 A1* | 7/2014 | O'Brien | G06F 1/1652 |
| | | | 29/592.1 |
| 2016/0147261 A1* | 5/2016 | Bohn | H10K 50/84 |
| | | | 455/566 |
| 2017/0212607 A1 | 7/2017 | Yoon | |
| 2018/0103550 A1* | 4/2018 | Seo | G06F 1/1601 |
| 2020/0304613 A1* | 9/2020 | Cha | G06F 1/1652 |
| 2022/0121240 A1* | 4/2022 | Jang | G06F 1/1624 |
| 2022/0311849 A1* | 9/2022 | Jia | H04M 1/0268 |
| 2023/0288955 A1* | 9/2023 | Park | G09F 9/30 |
| 2023/0421674 A1* | 12/2023 | Park | H04M 1/0268 |

FOREIGN PATENT DOCUMENTS

| | | |
|---|---|---|
| KR | 10-2017-0089664 | 8/2017 |
| KR | 10-2020-0117741 | 10/2020 |
| KR | 10-2021-0007773 | 1/2021 |
| KR | 10-2306982 | 10/2021 |
| KR | 10-2322916 | 11/2021 |
| KR | 10-2022-0060781 | 5/2022 |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2022-0120738, filed on Sep. 23, 2022, the contents of which are hereby incorporated by reference in its entirety.

BACKGROUND

1. Technical Field

The disclosure relates to a display device.

2. Description of the Related Art

Electronic devices that provide an image to a user, such as a smart phone, a digital camera, a notebook computer, a navigation unit, and a smart television, include a display device to display the image. The display device generates the image and provides the image to the user through a display screen thereof.

In recent years, with the technological development for the display device, various types of display devices are being developed. For example, various display devices, which are capable of being transformed into a curved shape, expanded or contracted, are being developed. The display devices are easy to carry and improve a user's convenience.

A flexible display device includes a flexible display panel. In case that the display device is expanded or contracted, the display device includes various components, such as a rail, a wire, a reel, a motor, and the like, to complement expansion and contraction operations thereof. In a case where the motor is used, the display device requires a battery and a space for accommodating the battery, however, an inner space of the display device becomes narrow due to the arrangement of the wire and reel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of being easily operated in an expansion configuration or a contraction configuration by gears, rails, and sliding hinges in case that an external force is applied to the display device.

Embodiments of the disclosure provide a display device including a display module, a support plate disposed under the display module and including a plate and a plurality of support bars arranged in a first direction with the plate, a moving plate disposed under the plate and coupled to the support bars, an expansion module disposed between the plate and the moving plate and movable in the first direction, a main case disposed under the moving plate and accommodating the moving plate and the expansion module, and a sliding hinge disposed between the main case and the moving plate. The sliding hinge provides an elasticity to the moving plate and the main case in a first movement direction that enables the moving plate and the main case to move away from each other in an expansion configuration in which the display module is expanded to outside of the main case, and the sliding hinge provides the elasticity to the moving plate and the main case in a second movement direction that enables the moving plate and the main case to move toward each other in a contraction configuration in which the display module is contracted inside of the main case.

Embodiments of the disclosure provide a display device including a display module, a support plate disposed under the display module and including a plate and a plurality of support bars arranged in a first direction with the plate, a moving plate disposed under the plate and coupled to the support bars, a main case disposed under the moving plate and accommodating the moving plate, and a sliding hinge disposed between the main case and the moving plate. The sliding hinge includes a first hinge connected to the main case, a second hinge disposed to face the first hinge and connected to the moving plate, and a coupling elastic member disposed between the first hinge and the second hinge. The sliding hinge provides an elasticity to the moving plate and the main case that enables the moving plate and the main case to move away from each other in response to the moving plate moving in a first movement direction away from the main case, and the sliding hinge provides the elasticity to the moving plate and the main case that enables the moving plate and the main case to move toward each other in response to the moving plate moving in a second movement direction toward to the main case.

According to the above, in response to an external force being applied to the display device, first gear portions, which move along rails, may rotate, and in response thereto, second gear portions and rollers also may rotate. Accordingly, the display device is able to be readily expanded or contracted without employing a battery.

The sliding hinges may be coupled to the main case and the moving plate, and each of the sliding hinges includes coupling elastic members. The sliding hinges apply the elasticity to the moving plate and the main case in the first movement direction that enables the moving plate and the main case move away from each other in response to the display device being changed to the expansion configuration, and the sliding hinges apply the elasticity to the moving plate and the main case in the second movement direction that enables the moving plate and the main case to move toward each other in response to the display device being changed to the contraction configuration. Accordingly, the display device may readily operate in either the expansion configuration or the contraction configuration.

Since a hook portion of the moving plate is extended to a coupling part disposed in the support plate, the hook portion pulls an expansion area of the support plate in a direction opposite to a movement direction of the support plate. Thus, in case that the display device is in the expansion configuration, a display panel is prevented from being wrinkled, a surface quality of the display panel is improved, and the support plate is expanded in a flat state.

In case that the display device is expanded, sidewall cases move in a third direction to be disposed at both sides of the display panel, which are opposite to each other in a second direction. Thus, a portion of side surfaces of the display panel is not exposed to outside. Accordingly, although external impacts are applied to an expansion area of the display panel, the sidewall cases cover the side surfaces of the display panel, and thus, the display panel is prevented from being damaged by the sidewall cases.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
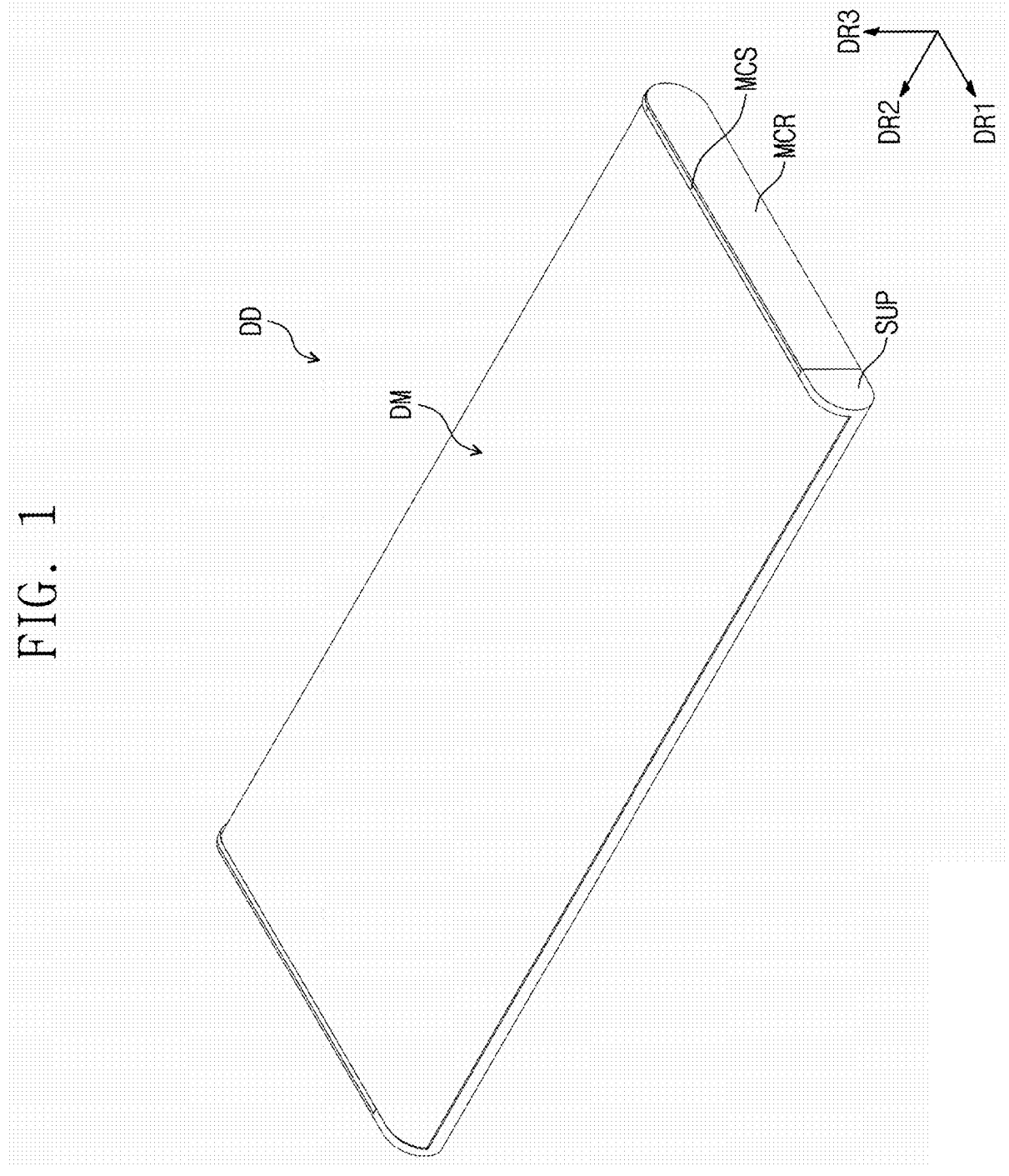
FIG. 1 is a perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers and/or reference characters refer to like elements throughout.

As used herein, the singular forms, "a," "any" and "the" are intended to include the plural forms as well, unless the context clearly indicates otherwise.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. For example, a first element, component, region, layer or section discussed below could be referred to as a second element, component, region, layer or section without departing from the teachings of the disclosure.

Embodiments described in the disclosure are described with reference to plan views and schematic cross-sectional views that are ideal schematic diagrams. Accordingly, shapes of the example views may vary depending on manufacturing technologies and/or tolerances. Thus, embodiments are not limited to shown specific forms and also include variations in form produced according to manufacturing processes. Therefore, regions illustrated in the drawings are by way of example, and the shapes of the regions illustrated in the drawings are intended to illustrate the specific shapes of the regions of elements and not to limit the scope of the disclosure.

The phrase "in a plan view" means viewing the object from the top (from the direction DR3), and the phrase "in a schematic cross-sectional view" means viewing a cross-section of which the object is vertically cut from the side (from the direction DR2).

The terms "overlap" or "overlapped" mean that a first object may be above or below or to a side of a second object, and vice versa. The term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A description that a component is "configured to" perform a specified operation, or described as having a specified "configuration" may be defined as a case where the component is constructed and arranged with structural features that can cause the component to perform the specified operation.

Embodiments may be described and illustrated in the accompanying drawings in terms of functional blocks, units, and/or modules. Each block, unit, and/or module of embodiments may be physically separated into two or more interacting and discrete blocks, units, and/or modules without departing from the scope of the disclosure. Further, the blocks, units, and/or modules of embodiments may be physically combined into more complex blocks, units, and/or modules without departing from the scope of the disclosure.

In case that an element is referred to as being "in contact" or "contacted" or the like to another element, the element may be in "electrical contact" or in "physical contact" with another element; or in "indirect contact" or in "direct contact" with another element.

Hereinafter, embodiments of the disclosure will be described with reference to accompanying drawings.

Figure 2:
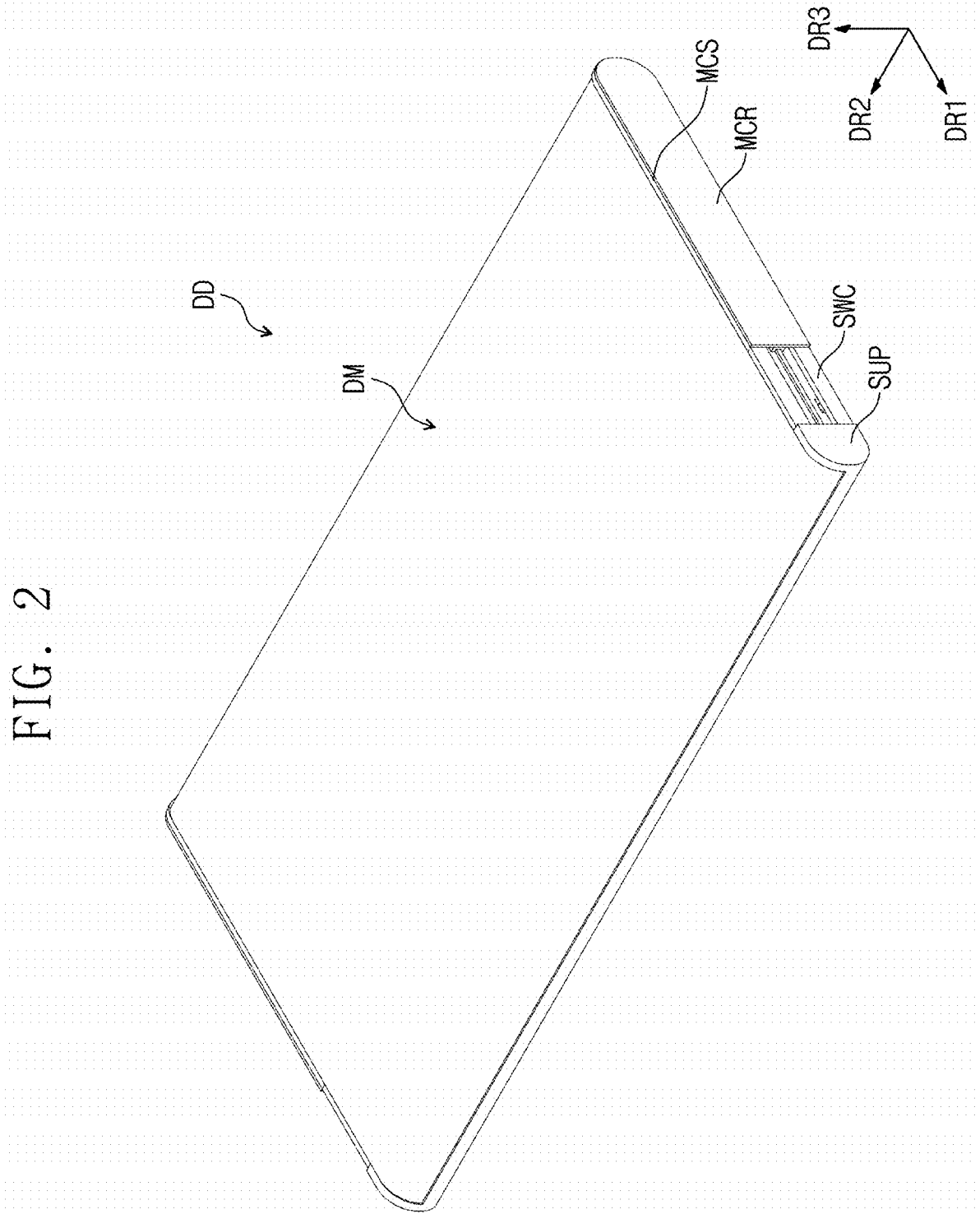
FIG. 2 is a perspective view of a display device shown in FIG. 1 in an expansion configuration.

FIG. 1 is a perspective view of a display device DD according to an embodiment of the disclosure. FIG. 2 is a perspective view of the display device DD shown in FIG. 1 in an expansion configuration.

Referring to FIGS. 1 and 2, the display device DD may have a rectangular shape defined by short sides extending in a first direction DR1 and long sides extending in a second direction DR2 intersecting (or crossing) the first direction DR1. However, the shape of the display device DD should not be limited to the rectangular shape, and the display device DD may have various shapes, such as a circular shape or a polygonal shape. The display device DD may be, but not limited to, a flexible display device.

Hereinafter, a direction substantially perpendicular to a plane defined by the first direction DR1 and the second direction DR2 may be referred to as a third direction DR3.

The display device DD may include a display module DM, a main case MCS, sidewall cases SWC, a main sidewall cover MCR, and a sub-plate SUP.

The sub-plate SUP may move in the first direction DR1 or a direction opposite to the first direction DR1 to be away from or to be close to the main case MCS. In case that the sub-plate SUP moves in the first direction DR1 or the direction opposite to the first direction DR1, a size of an exposed surface of the display module DM may be adjusted by the movement of the sub-plate SUP. As the sub-plate SUP moves, the display device DD may operate in a contraction configuration or the expansion configuration.

The display device DD may operate in the contraction configuration in case that the display module DM is inserted into the main case MCS. The display device DD may operate in the expansion configuration in case that the display module DM is expanded to an outside of the main case MCS. The main sidewall cover MCR may be provided in plural. The main sidewall covers MCR may be disposed at both sides of the main case MCS, which are opposite to each other in the second direction DR2. One side of both sides of the main sidewall covers MCR, which are opposite to each other in the first direction DR1, may have a semi-circular shape. The other side of the main sidewall covers MCR may have a straight line parallel to the third direction DR3. The one side of the main sidewall covers MCR may be defined as a side that is opposite to a side facing the sub-plate SUP.

In case that the display device DD is in the expansion configuration, two pairs of sidewall cases SWC may be respectively disposed at both sides of the display module DM, which are opposite to each other in the second direction DR2. The two pairs of the sidewall cases SWC may be spaced apart from each other in the second direction DR2. The sidewall cases SWC constituting one pair of sidewall cases SWC may face each other in the third direction DR3.

In case that the display device DD is in the contraction configuration, the sidewall cases SWC may be accommodated in the main case MCS. In case that the display device DD is in the expansion configuration, the sidewall cases SWC may be exposed to the outside. The movement of the sidewall cases SWC will be described in detail with reference to FIGS. 30A to 31B.

Figure 3:
FIG. 3 is an exploded perspective view of the display device shown in FIG. 2.
Figure 4:
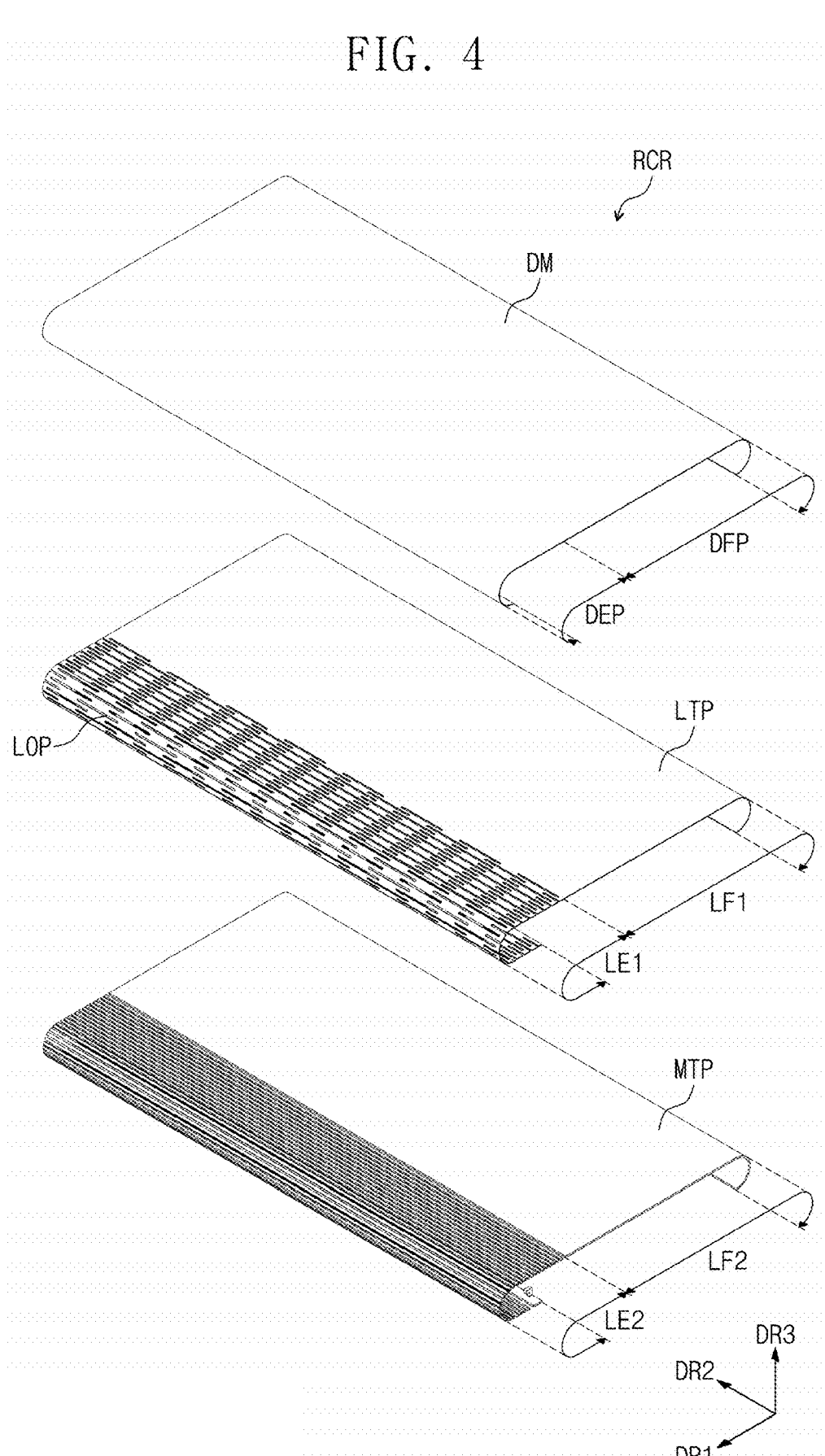
FIG. 4 is an exploded perspective view of a module set shown in FIG. 3.
Figures 5A, 5B:
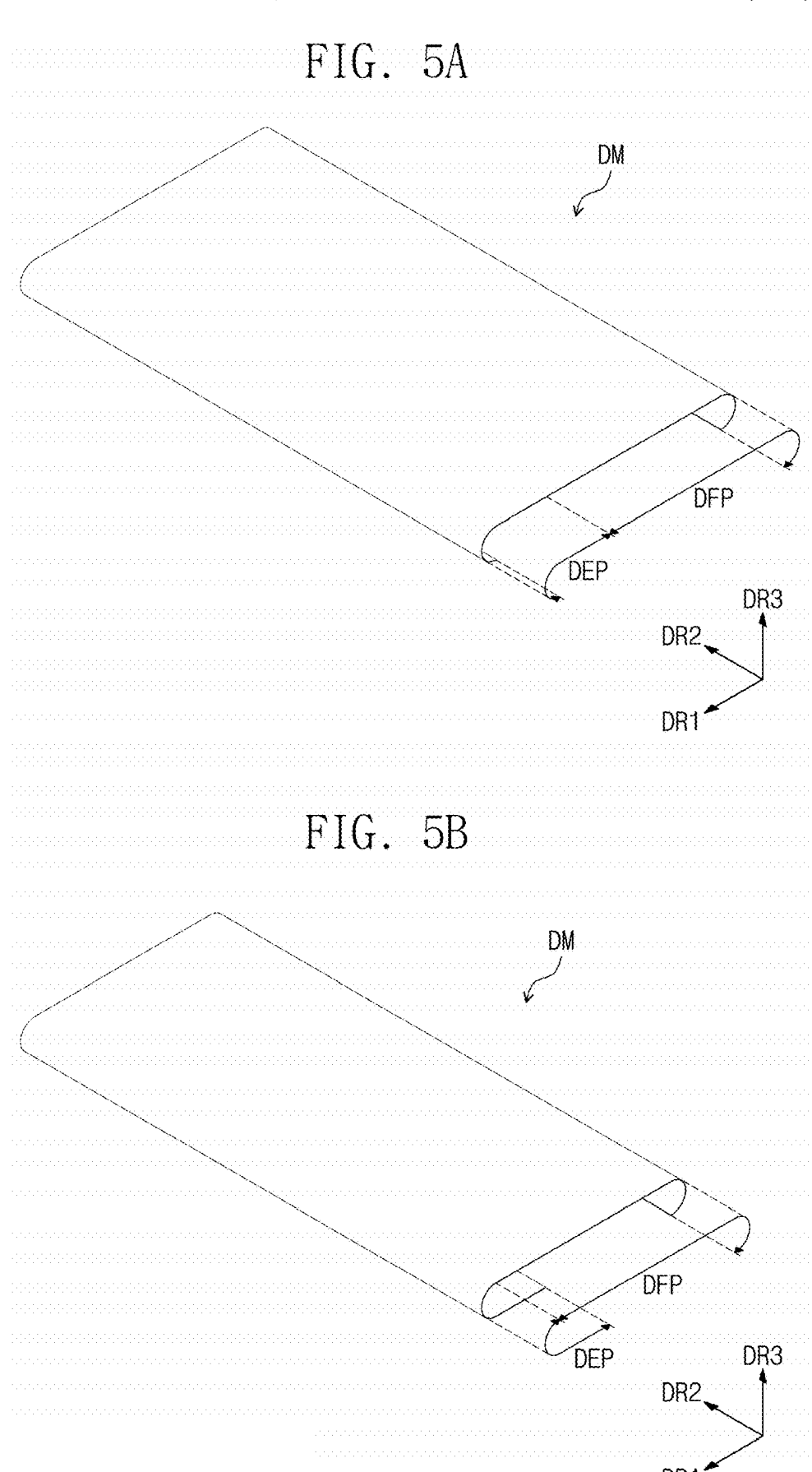
FIG. 5A is a view of a display module of FIG. 4 in an expansion configuration.
FIG. 5B is a view of the display module of FIG. 4 in a contraction configuration.

FIG. 3 is an exploded perspective view of the display device shown in FIG. 2. FIG. 4 is an exploded perspective view of a module set RCR shown in FIG. 3. FIG. 5A is a view of the display module DM of FIG. 4 in the expansion configuration. FIG. 5B is a view of the display module DM of FIG. 4 in the contraction configuration.

FIG. 3 is an exploded perspective view of the display device DD in the expansion configuration.

Referring to FIG. 3, the display device DD may include the sidewall cases SWC, the main case MCS, the main sidewall covers MCR, the module set RCR, a moving plate MPL, a roller module RMD, an expansion module EMD, the sub-plate SUP, and sliding hinges SHG.

The module set RCR may be accommodated in the main case MCS. The module set RCR may include the display module DM, an upper plate LTP, and a support plate MTP.

The moving plate MPL, the roller module RMD, the expansion module EMD, and the sliding hinges SHG may be disposed under the module set RCR. The moving plate MPL, the roller module RMD, the expansion module EMD, and the sliding hinges SHG may be disposed in the main case MCS.

The expansion module EMD may be expanded and contracted in the first direction DR1 and the direction opposite to the first direction DR1, respectively. The roller module RMD may be extended to the expansion module EMD. The roller module RMD may be extended to the moving plate MPL. The roller module RMD and the moving plate MPL may move in the first direction DR1 or the direction opposite to the first direction DR1. The sub-plate SUP may be extended to the moving plate MPL and the roller module RMD. The connection relation between the expansion module RMD, the moving plate MPL, the roller module RMD, and the sub-plate SUP will be described in detail with reference to FIGS. 15 to 19.

The sidewall cases SWC may be disposed at both sides of the moving plate MPL, which are opposite to each other in the second direction DR2. The sidewall cases SWC may be coupled to the moving plate MPL. The coupling relationship between the sidewall cases SWC and the moving plate MPL will be described in detail with reference to FIG. 21.

The sliding hinge SHG may be disposed between the main case MCS and the moving plate MPL. As an example, the sliding hinges SHG are indicated by a dotted line. The sliding hinge SHG may be provided in plural. Each of the sliding hinges SHG may be extended to the main case MCS and the moving plate MPL. The connection relationship between the sliding hinges SHG, the main case MCS, and the moving plate MPL will be described in detail with reference to FIGS. 23 and 25.

Referring to FIGS. 4, 5A, and 5B, in case that the display module DM is unfolded, the display module DM may have a rectangular shape with short sides extending in the first direction DR1 and long sides extending in the second direction DR2. In case that the display module DM is accommodated in the main case MCS, both sides opposite to each other in the first direction DR1 of the display module DM may have a convex curved shape toward the outside.

The display module DM may operate in the contraction configuration in which the display module DM is contracted inside the main case MCS of FIG. 3 or may operate in the expansion configuration in which the display module DM is expanded outside the main case MCS. The display module DM may include a fixed area DFP and an expansion area DEP. As shown in FIG. 1, in case that the display device DD is in the contraction configuration, a portion of the display module DM, which is flat and exposed to the outside, may be defined as the fixed area DFP, and a portion of the display module DM, which is not flat and not exposed to the outside, may be defined as the expansion area DEP.

As shown in FIG. 2, in case that the display device DD is in the expansion configuration, a portion of an expansion area DEP may be exposed to the outside to be flat. The expansion area DEP may extend from the fixed area DFP to the first direction DR1. As shown in FIG. 5A, the fixed area DFP and the expansion area DEP may be sequentially arranged in the first direction DR1.

In case that the display device DD of FIG. 1 is in the contraction configuration, the expansion area DEP may be disposed under the fixed area DFP as shown in FIG. 5B. The display module DM will be described in detail with reference to FIGS. 6 to 8.

Referring to FIG. 4, the upper plate LTP may be disposed under the display module DM. An upper surface of the upper plate LTP may be attached to a lower surface of the display module DM.

In case that the upper plate LTP is unfolded, the upper plate LTP may have a rectangular shape defined by short sides extending in the first direction DR1 and long sides extending in the second direction DR2. In case that the upper plate LTP is accommodated in the main case MCS, both sides of the upper plate LTP, which are opposite to each other in the first direction DR1, may have a convex curved shape toward the outside.

The upper plate LTP may include a metal material such as a stainless steel, e.g., SUS 316, however, the metal material for the upper plate LTP should not be limited thereto or thereby. According to an embodiment, the upper plate LTP may include a non-metal material such as a plastic material.

The upper plate LTP may include a first fixed portion LF1 and a first expansion portion LE1. The first fixed portion LF1 may overlap the fixed area DFP of the display module DM in the thickness direction DR3. The first expansion portion LE1 may overlap the expansion area DEP in the thickness direction DR3. The first expansion portion LE1 may extend from the first fixed portion LF1.

Opening patterns LOP may be defined through the first expansion portion LE1. The opening patterns LOP may overlap the expansion area DEP of the display module DM in the thickness direction DR3. As the opening patterns LOP are defined, a rigidity of the first expansion portion LE1 may be reduced. Accordingly, a flexibility of the upper plate LTP may be improved more in case that the opening patterns LOP are defined through the upper plate LTP than in case that the opening patterns LOP are not defined through the upper plate LTP. As a result, the upper plate LTP may be more readily folded.

The support plate MTP may be disposed under the upper plate LTP and the display module DM. An upper surface of the support plate MTP may be attached to a lower surface of the upper plate LTP. The support plate MTP may be coupled to the upper plate LTP by a welding process, however, the disclosure should not be limited thereto or thereby.

The support plate MTP may include a metal material such as a stainless steel, e.g., SUS 316, however, the metal material for the support plate MTP should not be limited thereto or thereby. According to an embodiment, the support plate MTP may include a non-metal material such as a plastic material.

The support plate MTP may include a second fixed portion LF2 and a second expansion portion LE2. The second fixed portion LF2 may overlap the first fixed portion LF1 and the fixed area DFP in the thickness direction DR3. The second expansion portion LE2 may overlap the first expansion portion LE1 and the expansion area DEP in the thickness direction DR3. The support plate MTP will be described in detail with reference to FIGS. 9 to 11.

Figure 6:
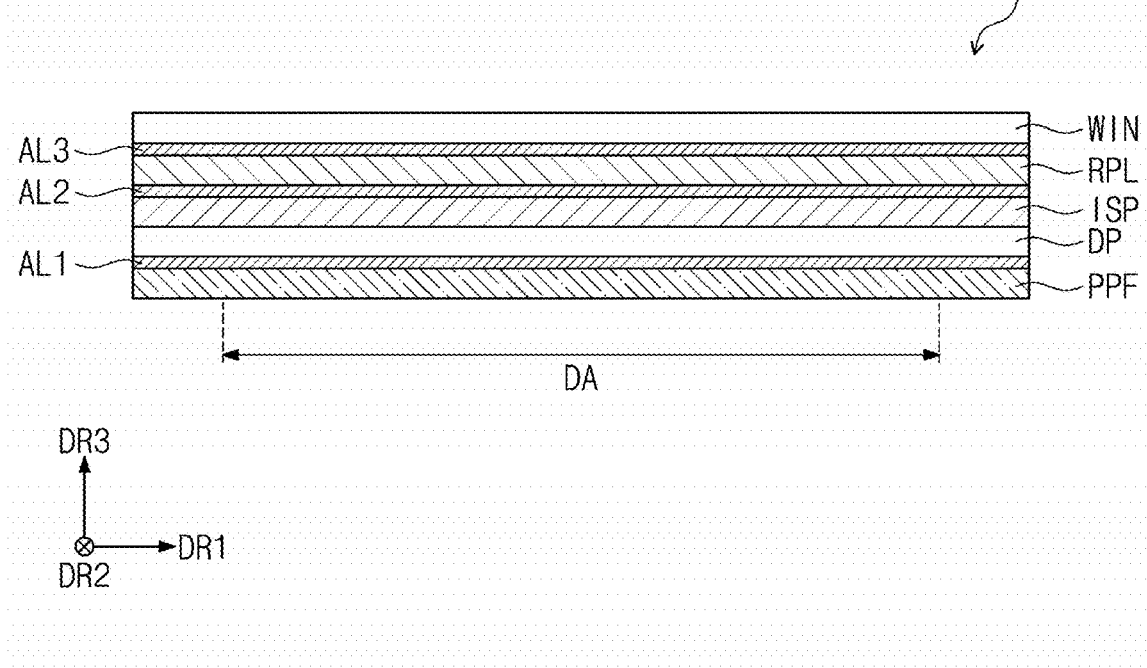
FIG. 6 is a schematic cross-sectional view of the display module shown in FIG. 4.

FIG. 6 is a schematic cross-sectional view in the second direction DR2 of the display module DM shown in FIG. 4.

FIG. 6 shows a schematic cross-sectional view of the display module DM viewed in the second direction DR2.

Referring to FIG. 6, the display module DM may include a display panel DP, an input sensing unit ISP, an anti-reflective layer RPL, a window WIN, a panel protective film PPF, and first, second, and third adhesive layers AL1, AL2, and AL3.

The display panel DP may be a flexible display panel. The display panel DP may be a light-emitting type display panel, however, it should not be so limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The input sensing unit ISP may be disposed on the display panel DP. The input sensing unit ISP may include sensing portions (not shown) to sense an external input by a capacitive method. The input sensing unit ISP may be manufactured directly on the display panel DP in case that the display device DD is manufactured, however, it should not be limited thereto or thereby. According to an embodiment, the input sensing unit ISP may be attached to the display panel DP by an adhesive layer after being manufactured separately from the display panel DP.

The anti-reflective layer RPL may be disposed on the input sensing unit ISP. The anti-reflective layer RPL may be defined as an external light reflection preventing film. The anti-reflective layer RPL may reduce a reflectance with respect to an external light incident to the display panel DP from the above of the display device DD.

In a case where the external light traveling to the display panel DP is provided to the user after being reflected by the display panel DP, like a mirror, the user may perceive the external light. The anti-reflective layer RPL may include color filters that display the same colors as those of pixels of the display panel DP to prevent the above-mentioned phenomenon.

The color filters may filter the external light such that the external light may have the same color as the pixels. In this case, the external light may not be perceived by the user. However, the disclosure should not be limited thereto or thereby, and the anti-reflective layer RPL may include a retarder and/or a polarizer to reduce the reflectance with respect to the external light.

The window WIN may be disposed on the anti-reflective layer RPL. The window WIN may protect the display panel DP, the input sensing unit ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF. The display panel DP and the panel protective film PPF may be coupled to each other by the first adhesive layer AL1. The second adhesive layer AL2 may be disposed between the anti-reflective layer RPL and the input sensing unit ISP, and the anti-reflective layer RPL and the input sensing unit ISP may be coupled to each other by the second adhesive layer AL2. The third adhesive layer AL3 may be disposed between the window WIN and the anti-reflective layer RPL, and the window WIN and the anti-reflective layer RPL may be coupled to each other by the third adhesive layer AL3.

Figure 7:
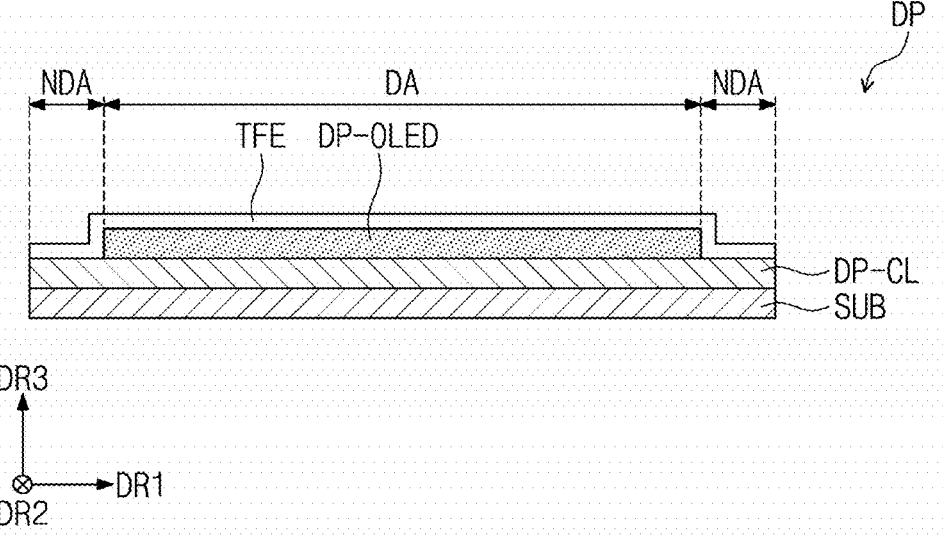
FIG. 7 is a schematic cross-sectional view of a display panel shown in FIG. 6.

FIG. 7 is a schematic cross-sectional view of the display panel DP shown in FIG. 6.

FIG. 7 shows a schematic cross-section of the display panel DP viewed in the second direction DR2.

Referring to FIG. 7, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The substrate SUB may include a flexible plastic material such as polyimide (PI). The display element layer DP-OLED may be disposed in the display area DA.

Pixels may be disposed in the circuit element layer DP-CL and the display element layer DP-OLED. Each pixel may include transistors disposed in the circuit element layer DP-CL and a light emitting element disposed in the display element layer DP-OLED and electrically connected to the transistors. Configurations of the pixel will be described in detail later.

The thin film encapsulation layer TFE may be disposed on the circuit element layer DP-CL to cover the display element layer DP-OLED. The thin film encapsulation layer TFE may protect the pixels from moisture, oxygen, and a foreign substance.

Figure 8:
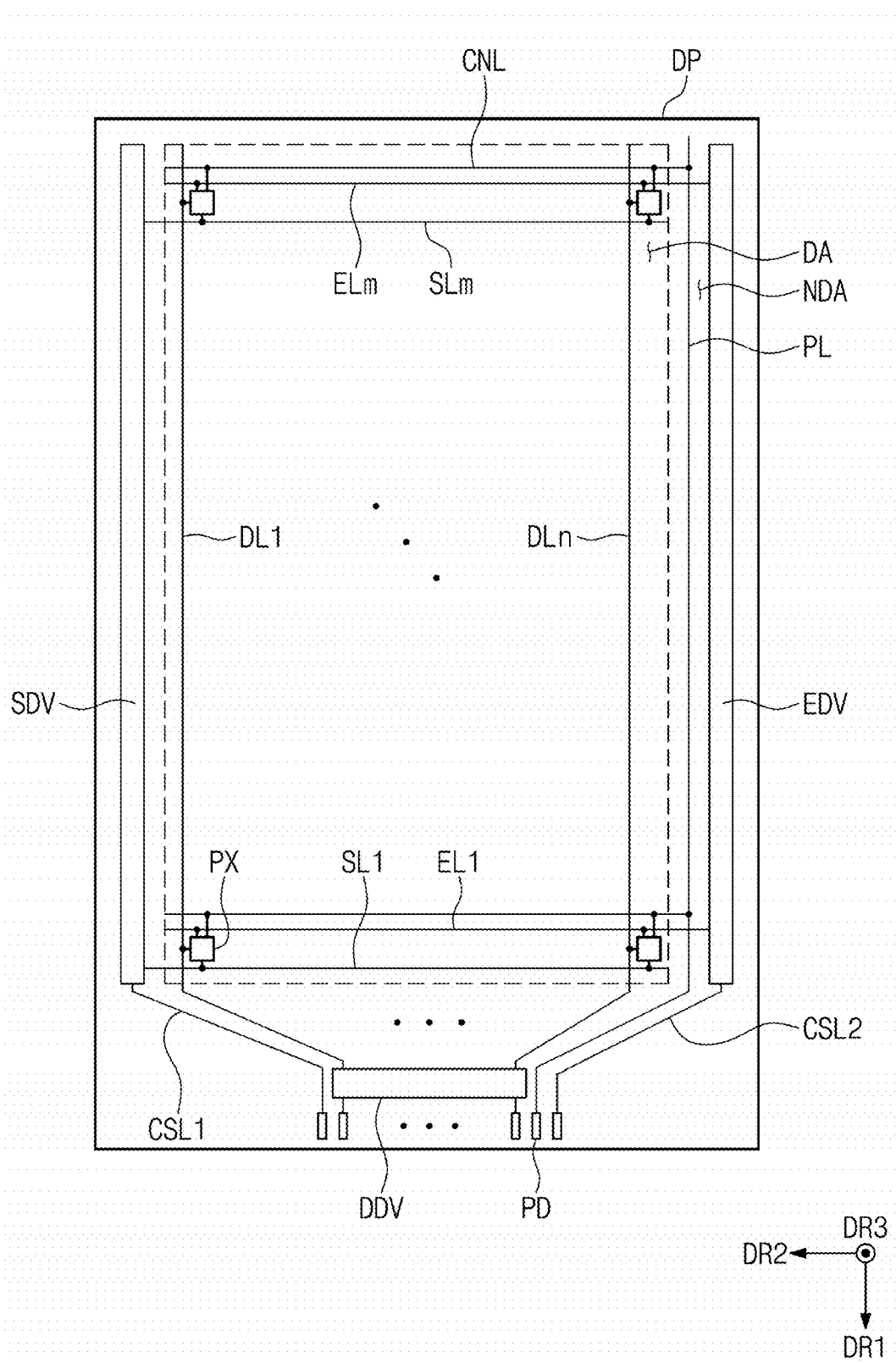
FIG. 8 is a plan view of the display panel shown in FIG. 7.

FIG. 8 is a plan view of the display panel DP shown in FIG. 7.

Referring to FIG. 8, the display panel DP may include a scan driver SDV, a data driver DDV, an emission driver EDV, and pads PD.

The display panel DP may have a rectangular shape having long sides extending in the first direction DR1 and short sides extending in the second direction DR2, however, the shape of the display panel DP should not be limited thereto or thereby. The display panel DP may include the display area DA and the non-display area NDA surrounding the display area DA.

The display panel DP may include pixels PX, scan lines SL1 to SLm, data lines DL1 to DLn, emission lines EL1 to Elm, first and second control lines CSL1 and CSL2, a power line PL, and connection lines CNL. Each of "m" and "n" is a natural number.

The pixels PX may be arranged in the display area DA. The scan driver SDV and the emission driver EDV may be disposed in the non-display area NDA respectively adjacent to the long sides of the display panel DP. The data driver DDV may be disposed in the non-display area NDA to be adjacent to one short side of the short sides of the display panel DP. The data driver DDV in a plan view may be disposed to be adjacent to a lower end of the display panel DP.

The scan lines SL1 to SLm may extend in the second direction DR2 and may be electrically connected to the pixels PX and the scan driver SDV. The data lines DL1 to DLn may extend in the first direction DR1 and may be electrically connected to the pixels PX and the data driver DDV. The emission lines EL1 to ELm may extend in the second direction DR2 and may be electrically connected to the pixels PX and the emission driver EDV.

The power line PL may extend in the first direction DR1 and may be disposed in the non-display area NDA. The power line PL may be disposed between the display area DA and the emission driver EDV, however, it should not be limited thereto or thereby. According to an embodiment, the power line PL may be disposed between the display area DA and the scan driver SDV.

The connection lines CNL may extend in the second direction DR2 and may be arranged in the first direction DR1. The connection lines CNL may be electrically connected to the power line PL and the pixels PX. A driving voltage may be applied to the pixels PX via the power line PL and the connection lines CNL electrically connected to the power line PL.

The first control line CSL1 may be electrically connected to the scan driver SDV and may extend toward the lower end of the display panel DP. The second control line CSL2 may be electrically connected to the emission driver EDV and may extend toward the lower end of the display panel DP. The data driver DDV may be disposed between the first control line CSL1 and the second control line CSL2.

The data lines DL1 to DLn may be electrically connected to corresponding pads PD via the data driver DDV. As an example, the data lines DL1 to DLn may be electrically connected to the data driver DDV, and the data driver DDV may be electrically connected to the pads PD corresponding to the data lines DL1 to DLn.

Although not shown in figures, a printed circuit board may be electrically connected to the pads PD, and a timing controller and a voltage generator may be disposed on the printed circuit board. The timing controller may be mounted on the printed circuit board after being manufactured as an integrated circuit chip. The timing controller and the voltage generator may be electrically connected to the pads PD via the printed circuit board.

A scan control signal may be applied to the scan driver SDV via the first control line CSL1. An emission control signal may be applied to the emission driver EDV via the second control line CSL2. A data control signal may be applied to the data driver DDV. The timing controller may receive image signals from the outside, may convert a data format of the image signals to a data format appropriate to an interface between the timing controller and the data driver DDV, and may provide the converted image signals to the data driver DDV.

The scan driver SDV may generate scan signals in response to the scan control signal. The scan signals may be applied to the pixels PX via the scan lines SL1 to SLm. The scan signals may be sequentially applied to the pixels PX.

The data driver DDV may generate data voltages corresponding to the image signals in response to the data control signal. The data voltages may be applied to the pixels PX via the data lines DL1 to DLn. The emission driver EDV may generate emission signals in response to the emission control signal. The emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 9:
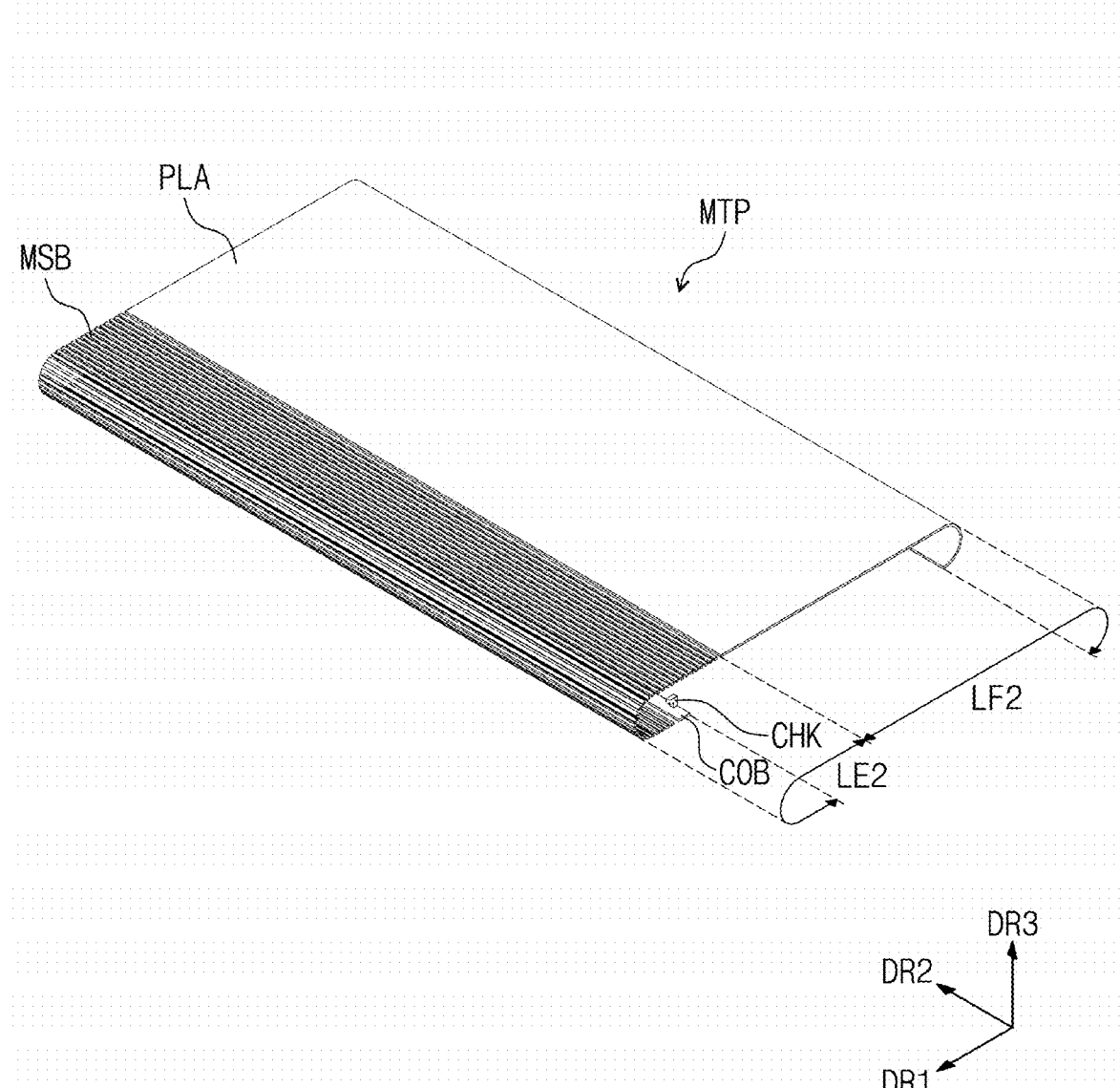
FIG. 9 is a perspective view of a support plate shown in FIG. 4.
Figure 10:
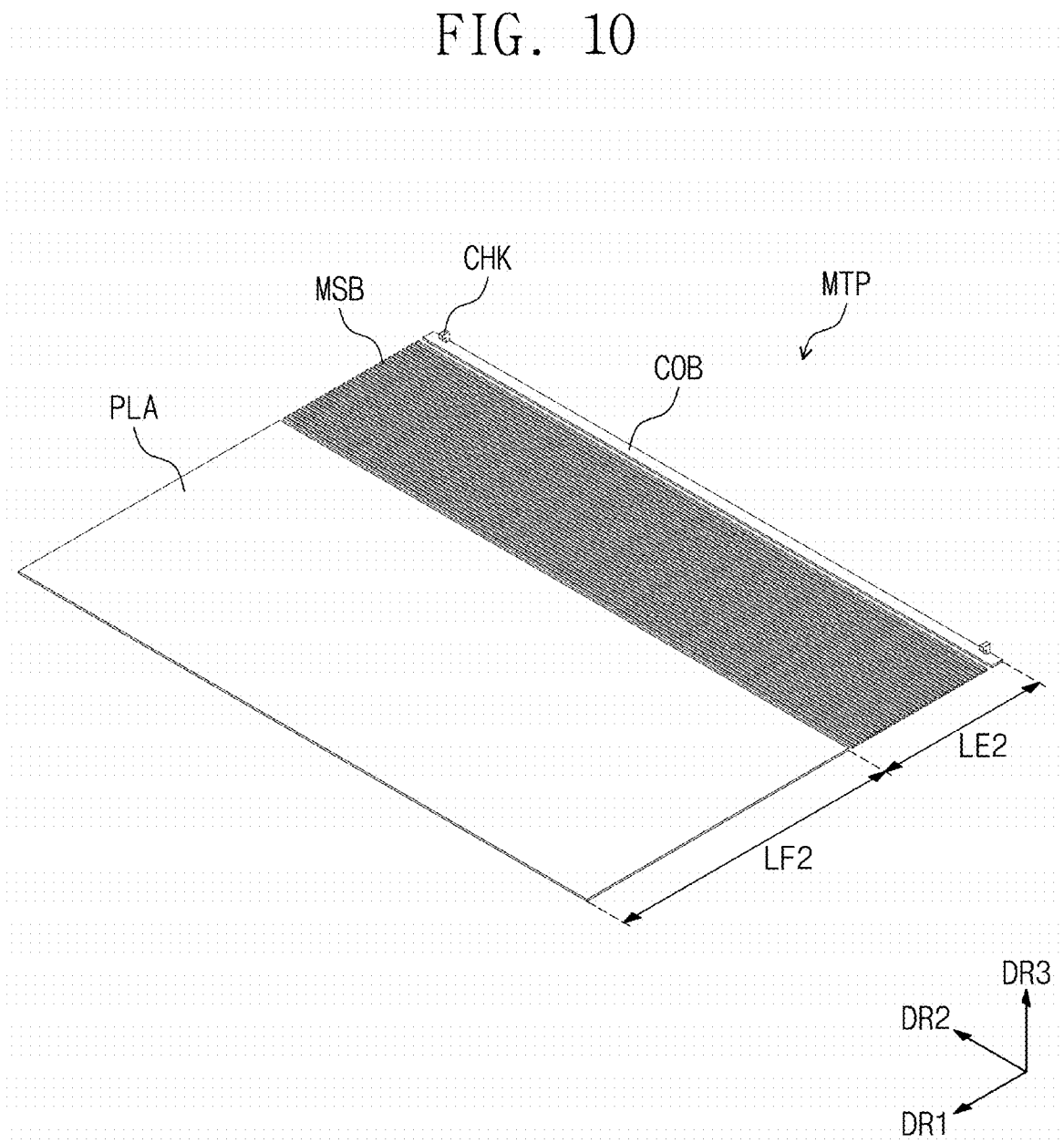
FIG. 10 is a perspective view of the support plate shown in FIG. 9 in a flat state.
Figure 11:
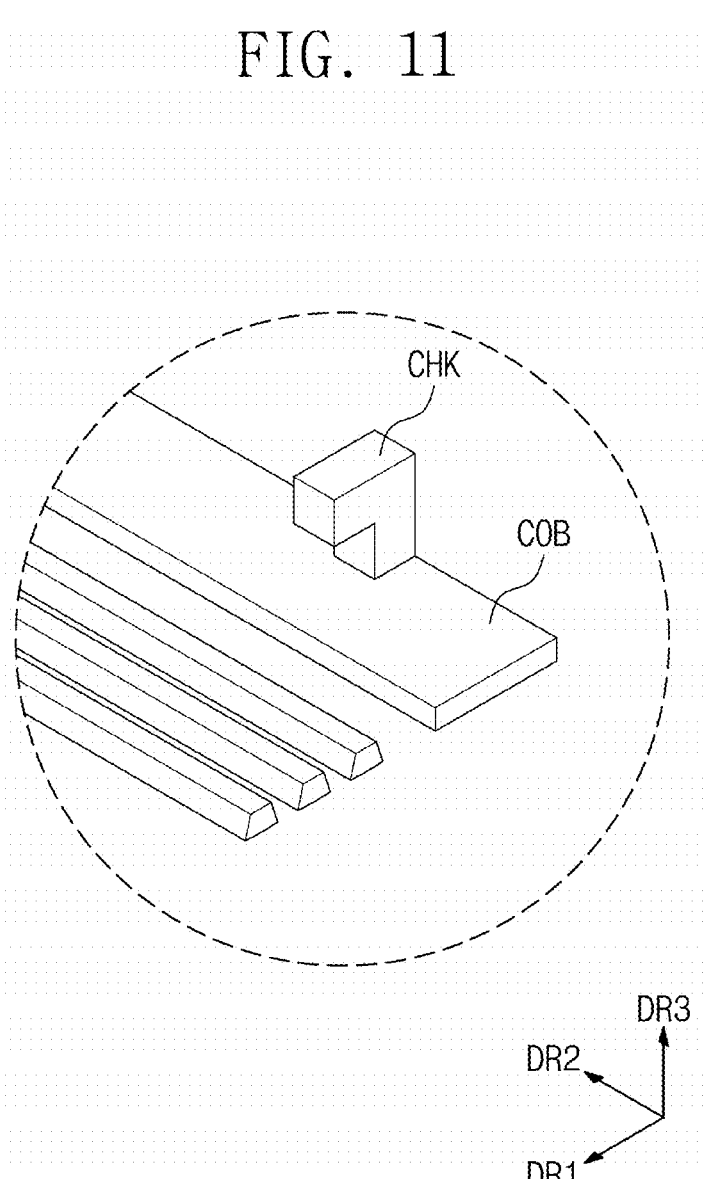
FIG. 11 is an enlarged view of a coupling part shown in FIGS. 9 and 10.

FIG. 9 is a perspective view of the support plate MTP shown in FIG. 4. FIG. 10 is a perspective view of the support plate MTP of FIG. 9 that is stretched out to be in a flat state. FIG. 11 is an enlarged view of a coupling part shown in FIGS. 9 and 10.

Referring to FIGS. 9, 10, and 11, the support plate MTP may include the second fixed portion LF2 and the second expansion portion LE2. The second fixed portion LF2 may include a plate PLA having a rectangular shape defined by short sides extending in the first direction DR1 and long sides extending in the second direction DR2 in response to being unfolded. In case that the support plate MTP is accommodated in the main case MCS shown in FIG. 3, one side of both sides of the second fixed portion LF2, which are opposite to each other in the first direction DR1, may have a curved shape. The one side of the second fixed portion LF2 may be defined as a side that is opposite to the other side of the second fixed portion LF2 facing the second expansion portion LE2.

The second expansion portion LE2 may include support bars MSB. The support bars MSB may extend in the second direction DR2 and may be arranged in the first direction DR1. The support bars MSB and the plate PLA may be arranged in the first direction DR1. An area between two support bars MSB adjacent to each other may overlap, in the thickness direction DR3, the opening patterns LOP defined in the upper plate LTP shown in FIG. 4.

Among the support bars MSB, the support bar MSB disposed farthest from the plate PLA may be defined as a coupling support bar COB. The support plate may include coupling parts CHK. The coupling parts CHK may be disposed on an upper surface of the coupling support bar COB. The coupling parts CHK may be disposed adjacent to both sides of the coupling support bar COB, which are opposite to each other in the second direction DR2.

The coupling parts CHK may extend from the coupling support bar COB to the third direction DR3 and the first direction DR1. The coupling parts CHK and the coupling support bar COB may be integral with each other, however, it should not be limited thereto or thereby. According to an embodiment, the coupling parts CHK may be extended to the coupling support bar COB after being manufactured separately from the coupling support bar COB. The coupling parts CHK viewed in the second direction DR2 may have an upside down L shape. The coupling parts CHK may be slidably coupled in the first direction DR1 to the moving plate MPL of FIG. 3. The coupling relationship between the coupling parts CHK and the moving plate MPL will be described in detail with reference to FIG. 24.

Figure 12A:
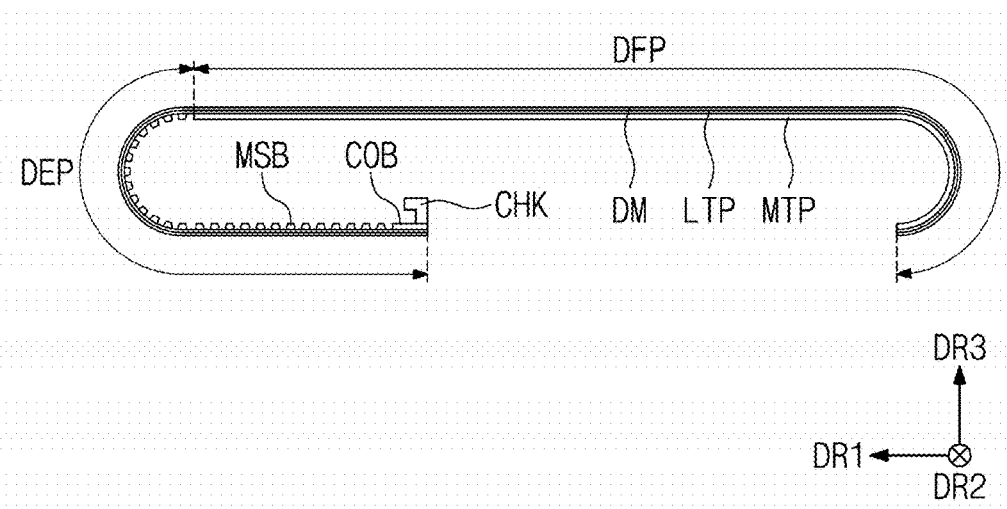
FIGS. 12A and 12B are side views of the module set shown in FIG. 4.
Figure 12B:
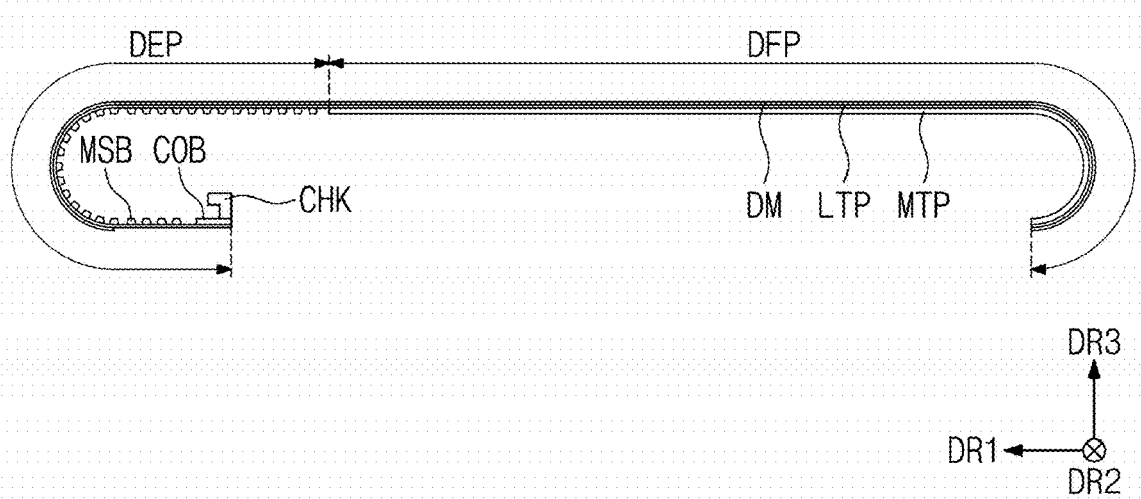

FIGS. 12A and 12B are side views of the module set shown in FIG. 4.

The display module DM, the upper plate LTP, and the support plate MTP of FIGS. 12A and 12B are substantially the same as the display module DM, the upper plate LTP, and the support plate MTP of FIGS. 3 to 11, and thus, details thereof will be omitted.

FIGS. 12A and 12B show side views of the module set viewed in the second direction DR2.

Referring to FIGS. 12A and 12B, the display module DM, the upper plate LTP, and the support plate MTP may be extended to each other. The support plate MTP may have substantially the same length as that of the upper plate LTP in the first direction DR1. The display module DM may have a length shorter than the length of the support plate MTP and the upper plate LTP in the first direction DR1.

In case that the operation configuration of the display device DD shown in FIG. 1 is changed from the contraction configuration to the expansion configuration, the portion of the expansion area DEP may be exposed flat to the outside. As an example, in case that the support bars MSB of the support plate MTP move along an outer surface of the roller module RMD shown in FIG. 3, the upper plate LTP and the display module DM attached to the support plate MTP may move in the first direction DR1 and the third direction DR3. The movement of the support plate MTP will be described in detail with reference to FIG. 29.

Figure 13:
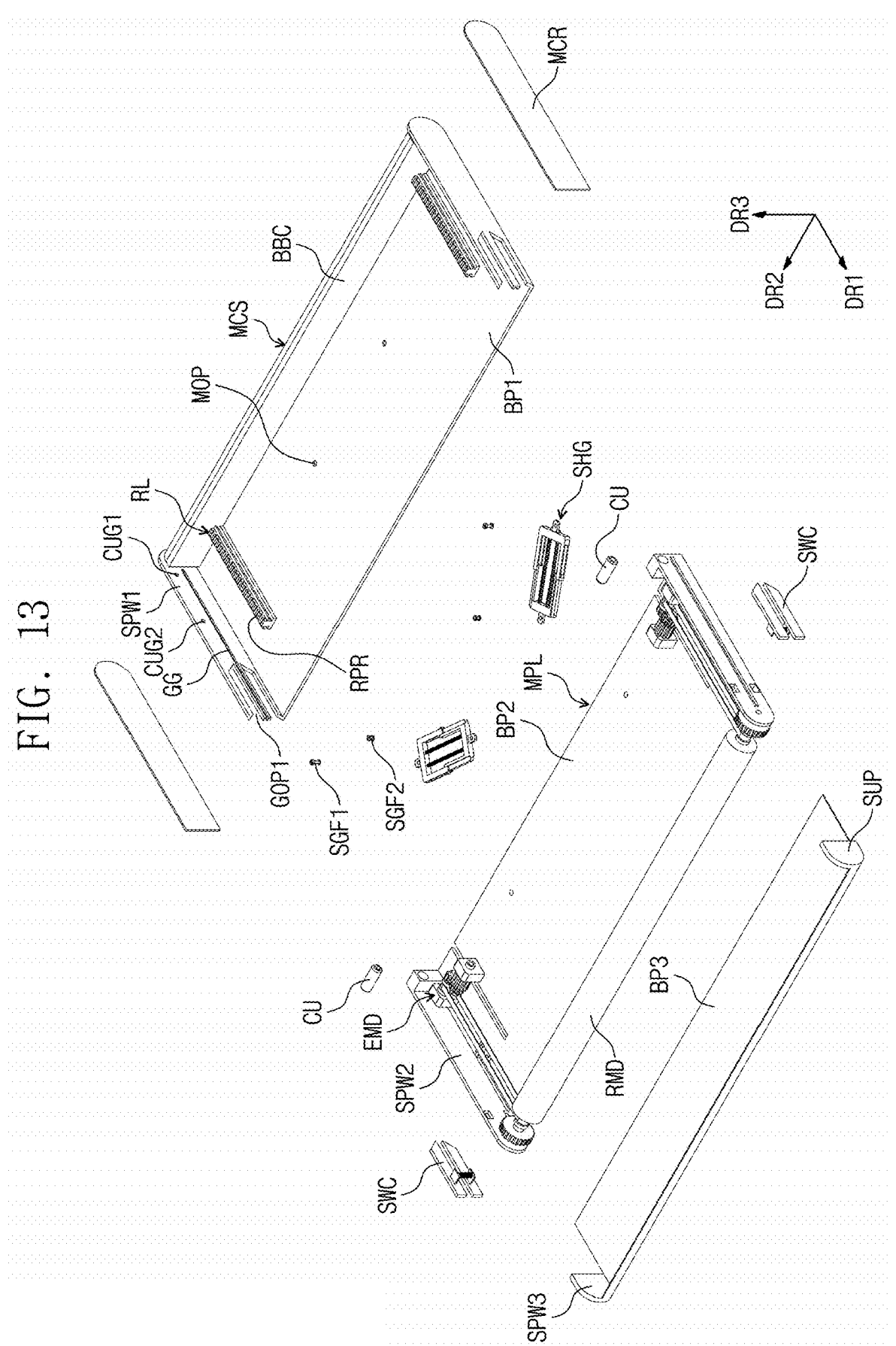
FIG. 13 is an exploded perspective view of a main case, sliding hinges, a moving plate, an expansion module, a roller module, sidewall cases, and a sub-plate shown in FIG. 3.
Figure 14:
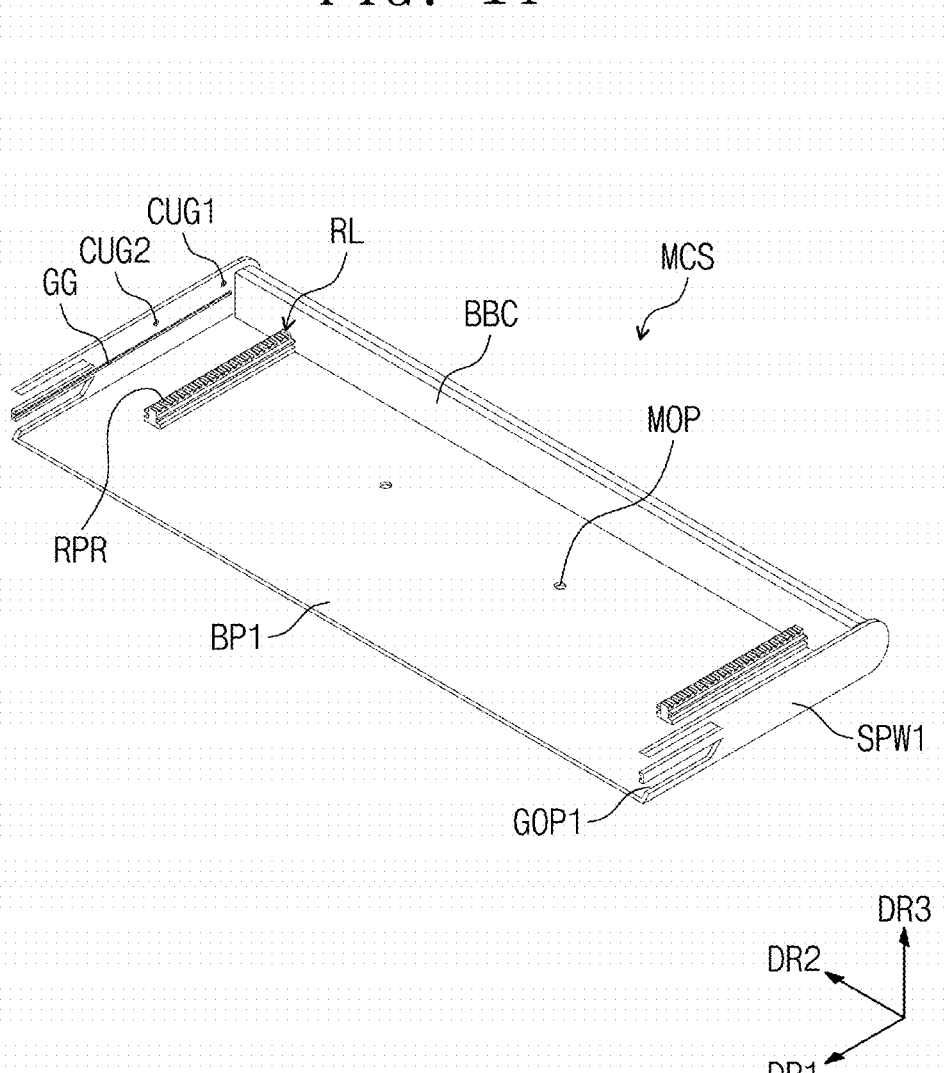
FIG. 14 is a perspective view of the main case shown in FIG. 13.

FIG. 13 is a view of the main case MCS, the sliding hinges SHG, the moving plate MPL, the expansion module EMD, the roller module RMD, the sidewall cases SWC, the main sidewall cover MCR, and the sub-plate SUP shown in FIG. 3. FIG. 14 is a perspective view of the main case MCS shown in FIG. 13.

FIG. 13 is an exploded perspective view of the main case MCS, the sliding hinges SHG, the moving plate MPL, the expansion module EMD, the roller module RMD, the main sidewall cover MCR, the sidewall cases SWC, and the sub-plate SUP shown in FIG. 3.

Referring to FIGS. 13 and 14, the main case MCS may include a first bottom portion BP1, first sidewall portions SPW1, a fixing cover BBC, and rails RL. The first bottom portion BP1 may have a plate shape defined by the first direction DR1 and the second direction DR2. The first bottom portion BP1 also may comprise first and second first bottom portion sides that are opposite to each other in the second direction DR2, and third and fourth first bottom portion sides that are opposite to each other in the first direction DR1. The rails RL may be disposed on the first bottom portion BP1. The rails RL may extend in the first direction DR1. The rails RL may include protrusions (RPR).

The first bottom portion BP1 may be provided with main openings MOP defined therethrough. The main openings MOP may be spaced apart from each other in the second direction DR2. The main openings MOP may be defined between the rails RL. The main openings MOP may have a circular shape in a plan view.

The fixing cover BBC may be disposed adjacent to one side of the third and fourth first bottom portion sides of the first bottom portion BP1, which are opposite to each other in the first direction DR1, and may extend in the third direction DR3. The third first bottom portion side of the first bottom portion BP1 may be defined as disposed opposite to fourth first bottom portion side of the first bottom portion BP1 facing the expansion module EMD in the first direction DR1. The fixing cover BBC may extend in the second direction DR2.

One side of the fixing cover BBC may have a plane shape defined by the second direction DR2 and the third direction DR3. The one side of the fixing cover BBC may face the expansion module EMD.

The first sidewall portions SPW1 may extend upwards from both of the first and second first bottom portion sides of the first bottom portion BP1, which are opposite to each other in the second direction DR2, to the third direction DR3. The first sidewall portions SPW1 may face each other in the second direction DR2.

One side of both sides of each of the first sidewall portions SPW1, which are opposite to each other in the first direction DR1, may have a curved shape. The other side of the both sides of each of the first sidewall portions SPW1, which are opposite to each other in the first direction DR1, may comprise first guide openings GOP1 defined therethrough. The first guide openings GOP1 may extend from the other side of the first sidewall portions SPW1 to the one side of the first sidewall portions SPW1 in the direction opposite to the first direction DR1. An end of each of the first guide openings GOP1 may have a slant shape. The fixing cover BBC may be in contact with the one side of each of the first sidewall portions SPW1.

First control grooves CUG1 and second control grooves CUG2 may be defined in inner side surfaces of the first sidewall portions SPW1 facing each other. A pair of the first control groove CUG1 and the second control groove CUG2 may be arranged in the first direction DR1.

Guide grooves GG may be defined in the inner side surfaces of the first sidewall portions SPW1 facing each other. The guide grooves GG may extend from the other side of the first sidewall portions SPW1 to the one side of the first sidewall portions SPW1 in the direction opposite to the first direction DR1. The guide grooves GG may be defined between the first guide openings GOP1 opposite to each other in the third direction DR3.

The main sidewall cover MCR may be attached to the first sidewall portions SPW1 of the main case MCS. The main sidewall cover MCR may be attached to outer side surfaces of the first sidewall portions SPW1.

The one side of the both sides of the main sidewall cover MCR, which are opposite to each other in the first direction DR1, may have a curved shape. The other side of the both sides of the main sidewall cover MCR, which are opposite to each other in the first direction DR1, may have a straight line shape substantially parallel to the third direction DR3. The one side of the main sidewall cover MCR may be defined as a side that is opposite to the other side of the main sidewall cover MCR facing the moving plate MPL.

Referring to FIG. 13, the moving plate MPL may include a second bottom portion BP2 and second sidewall portions SPW2. The second bottom portion BP2 may have a plate shape defined by the first direction DR1 and the second direction DR2. The second bottom portion BP2 also may comprise first- and second-second bottom portion sides that are opposite to each other in the second direction DR2, and third and fourth second bottom portion sides that are opposite to each other in the first direction DR1.

The second sidewall portions SPW2 may extend from both of the first- and second-second bottom portion sides of the second bottom portion BP2, which are opposite to each other in the second direction DR2, to the third direction DR3. The second sidewall portions SPW2 may face each other in the second direction DR2. One side of both sides of the second sidewall portions SPW2, which are opposite to each other in the first direction DR1, may have a curved shape. The one side of the second sidewall portions SPW2 may face the sub-plate SUP. The moving plate MPL will be described in detail with reference to FIGS. 15 to 16B.

The expansion module EMD and the roller module RMD may be coupled to the moving plate MPL. The expansion module EMD may be disposed on the second bottom portion BP2. The roller module RMD may be disposed on the second bottom portion BP2. The roller module RMD may be disposed between the second sidewall portions SPW2. The expansion module EMD, the roller module RMD, and the moving plate MPL may be extended to each other. The connection relationship between the expansion module EMD, the roller module RMD, and the moving plate MPL will be described in detail with reference to FIGS. 14 to 19.

The sub-plate SUP may be disposed under the moving plate MPL. The sub-plate SUP may be disposed on a lower surface of the second bottom portion BP2. The sub-plate SUP may be coupled to the moving plate MPL. The sub-plate SUP may be coupled to outer side surfaces of the second sidewall portions SPW2, which are opposite to inner side surfaces of the second sidewall portions SPW2, which face each other. The coupling relationship between the sub-plate SUP and the moving plate MPL will be described in detail with reference to FIG. 14.

The sub-plate SUP may include a third bottom portion BP3 and third sidewall portions SPW3. One side of both sides of the third bottom portion BP3, which are opposite to each other in the first direction DR1, may have a curved shape. The one side of the third bottom portion BP3 may be defined as an outer side that does not face the one side of the second sidewall portions.

The third sidewall portions SPW3 may extend upward from the both sides of the third bottom portion BP3, which are opposite to each other in the second direction. The third sidewall portions SPW3 may be adjacent to the one side of the third bottom portion BP3. The third sidewall portions SPW3 may face each other in the second direction DR2.

The roller module RMD and the second sidewall portions SPW2 may be disposed between the third sidewall portions SPW3 facing each other in the second direction DR2. The roller module RMD may be disposed adjacent to the one side of the third bottom portion BP3.

The third sidewall portions SPW3 may be extended to the roller module RMD by the second sidewall portions SPW2. The connection relationship between the third sidewall portions SPW3, the roller module RMD, and the second sidewall portions SPW2 will be described in detail with reference to FIG. 15.

Viewed in the second direction DR2, one side, which face the first guide openings GOP1, of both sides of each of the sidewall cases SWC, which are opposite to each other in the first direction DR1, may have a slant shape. The other side of the both sides of each of the sidewall cases SWC, which are opposite to each other in the first direction DR1, may have a straight line shape substantially parallel to the third direction DR3. The shape of the first guide openings GOP1 may be substantially the same as that of the sidewall cases SWC.

The sidewall cases SWC may be coupled to the second sidewall portions SPW2. The coupling relationship between the sidewall cases SWC and the second sidewall portions SPW2 will be described in detail with reference to FIG. 21.

Control units CU may be coupled to the moving plate MPL. The coupling relationship between the control units CU and the moving plate MPL will be described in detail with reference to FIG. 17.

The sliding hinges SHG may be extended to the main case MCS and the moving plate MPL. The sliding hinges SHG may be extended to the main case MCS and the moving plate MPL by first sliding fixing portions SGF1 and second sliding fixing portions SGF2. The connection relationship between the sliding hinges SHG, the main case MCS, and the moving plate MPL will be described in detail with reference to FIGS. 23 and 25.

Figure 15:
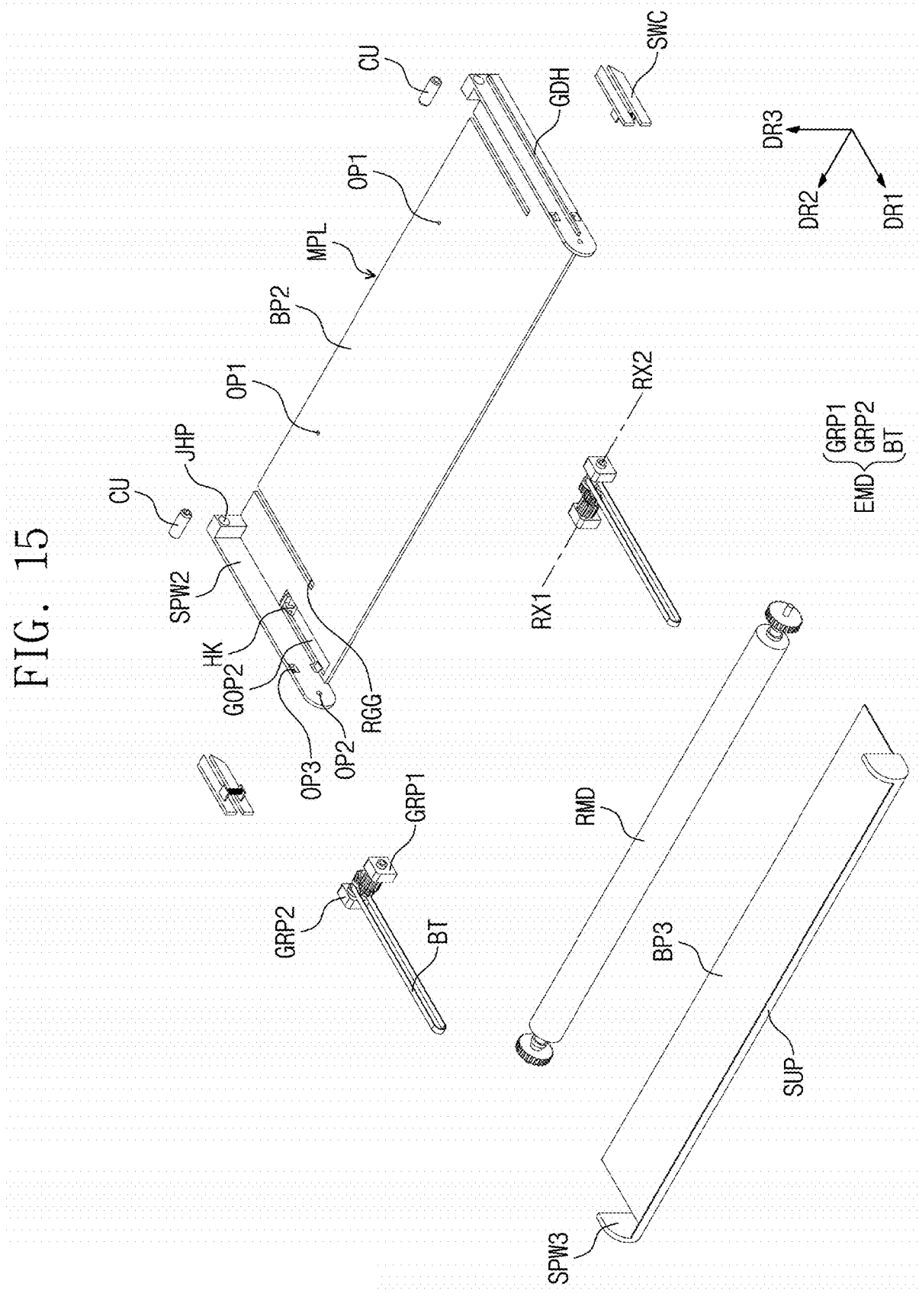
FIG. 15 is a perspective view of a moving plate, control units, an expansion module, and a roller module.
Figure 16A:
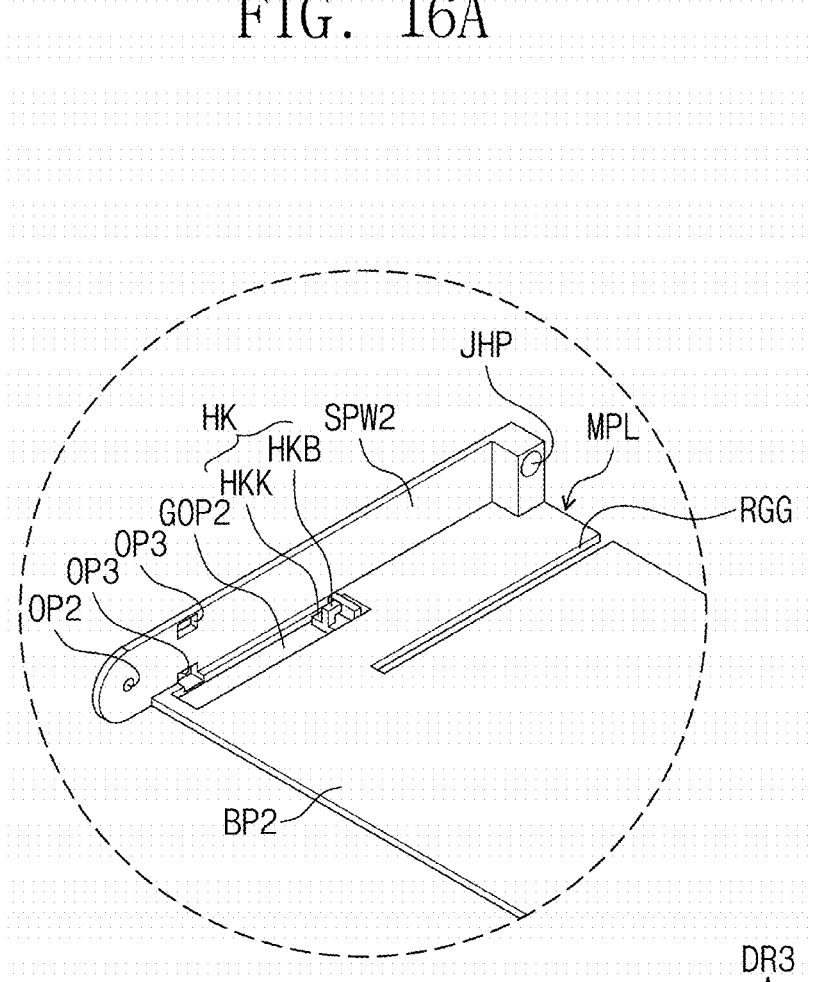
FIGS. 16A and 16B are enlarged views of the moving plate shown in FIG. 15.
Figure 16B:
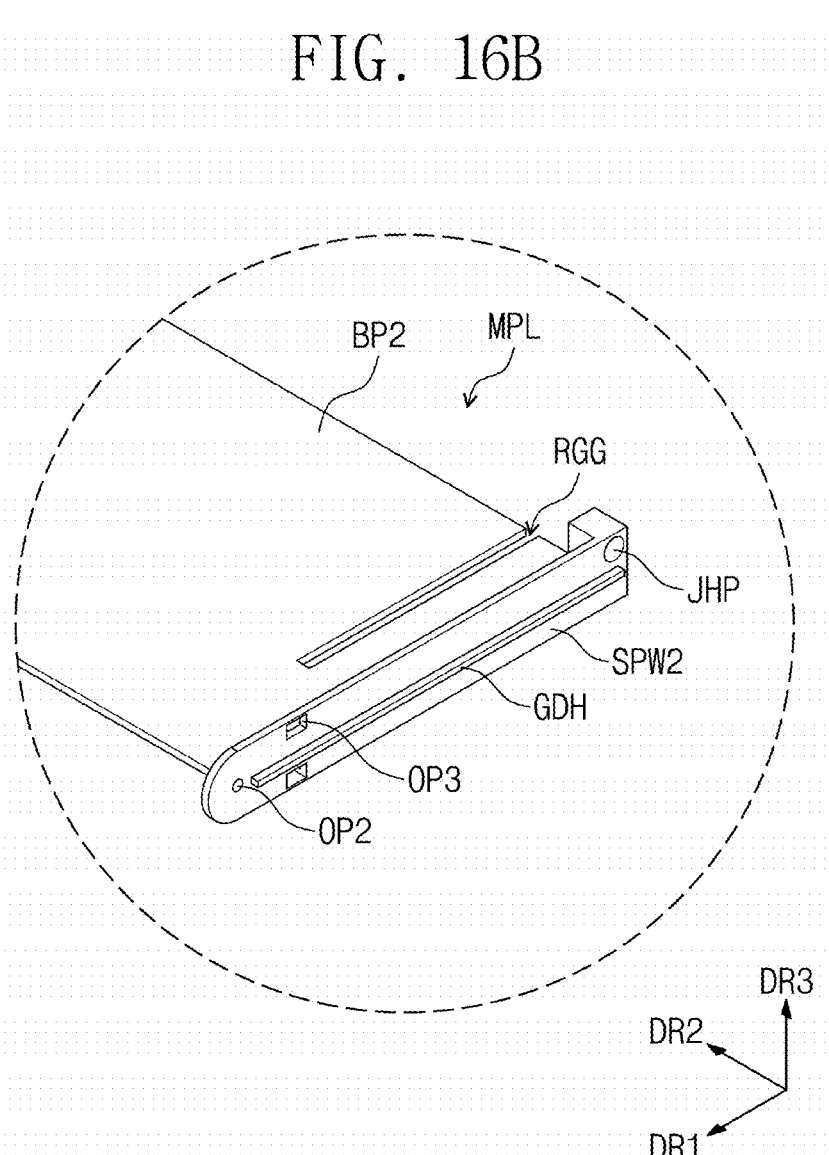
Figure 17:
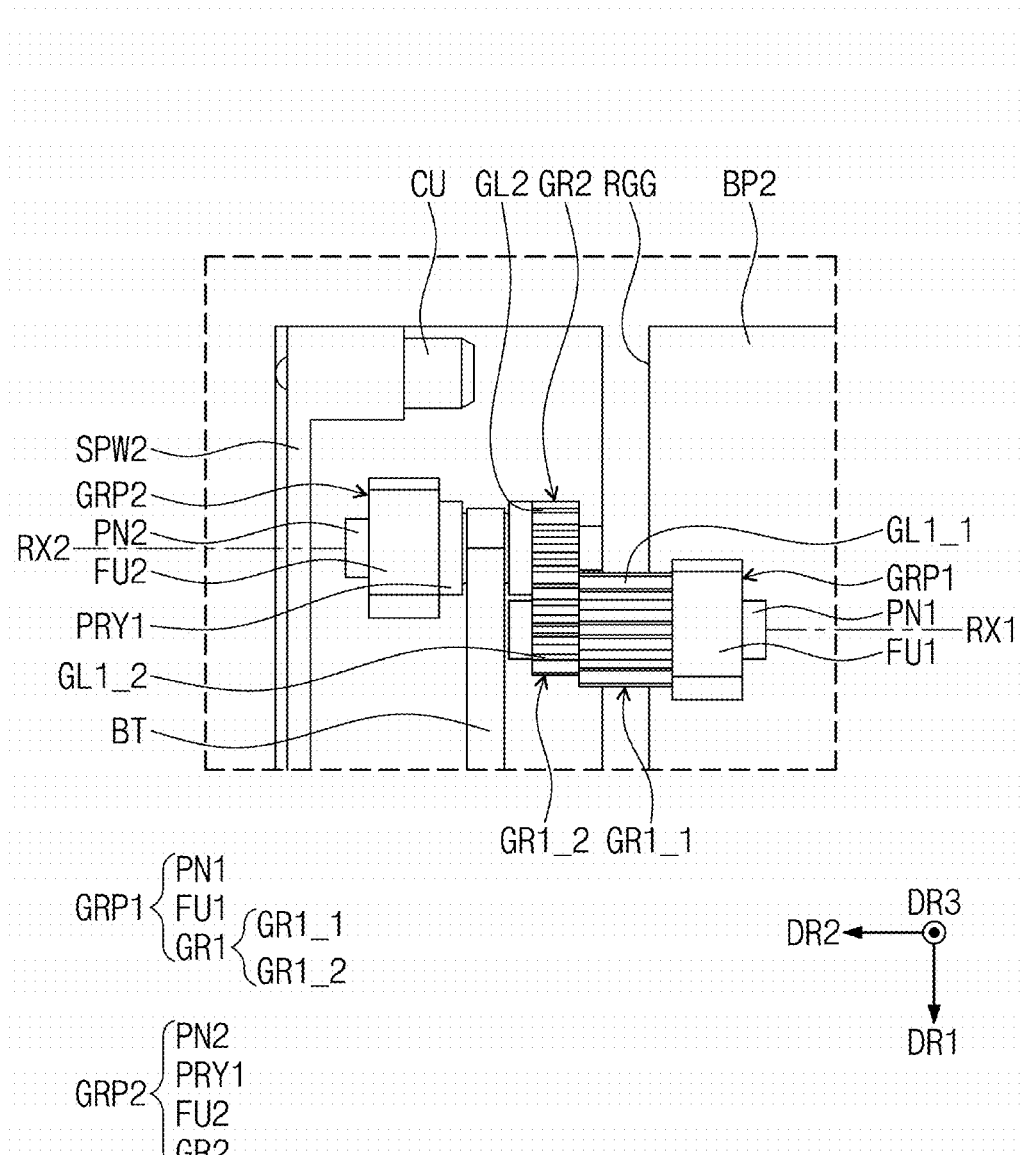
FIG. 17 is an enlarged view of the expansion module, the control unit, and the moving plate shown in FIG. 15.
Figure 18:
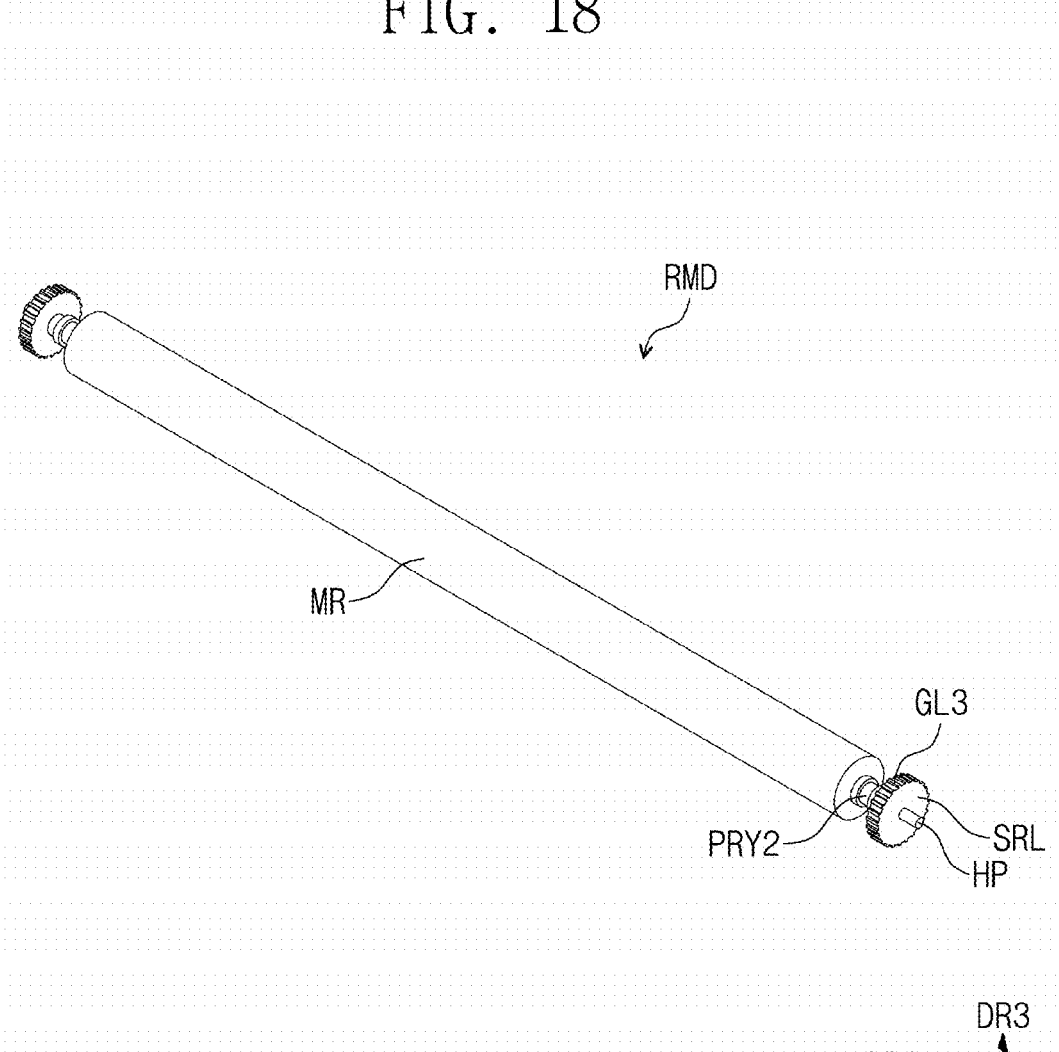
FIG. 18 is a view of the roller module shown in FIG. 15.
Figure 19:
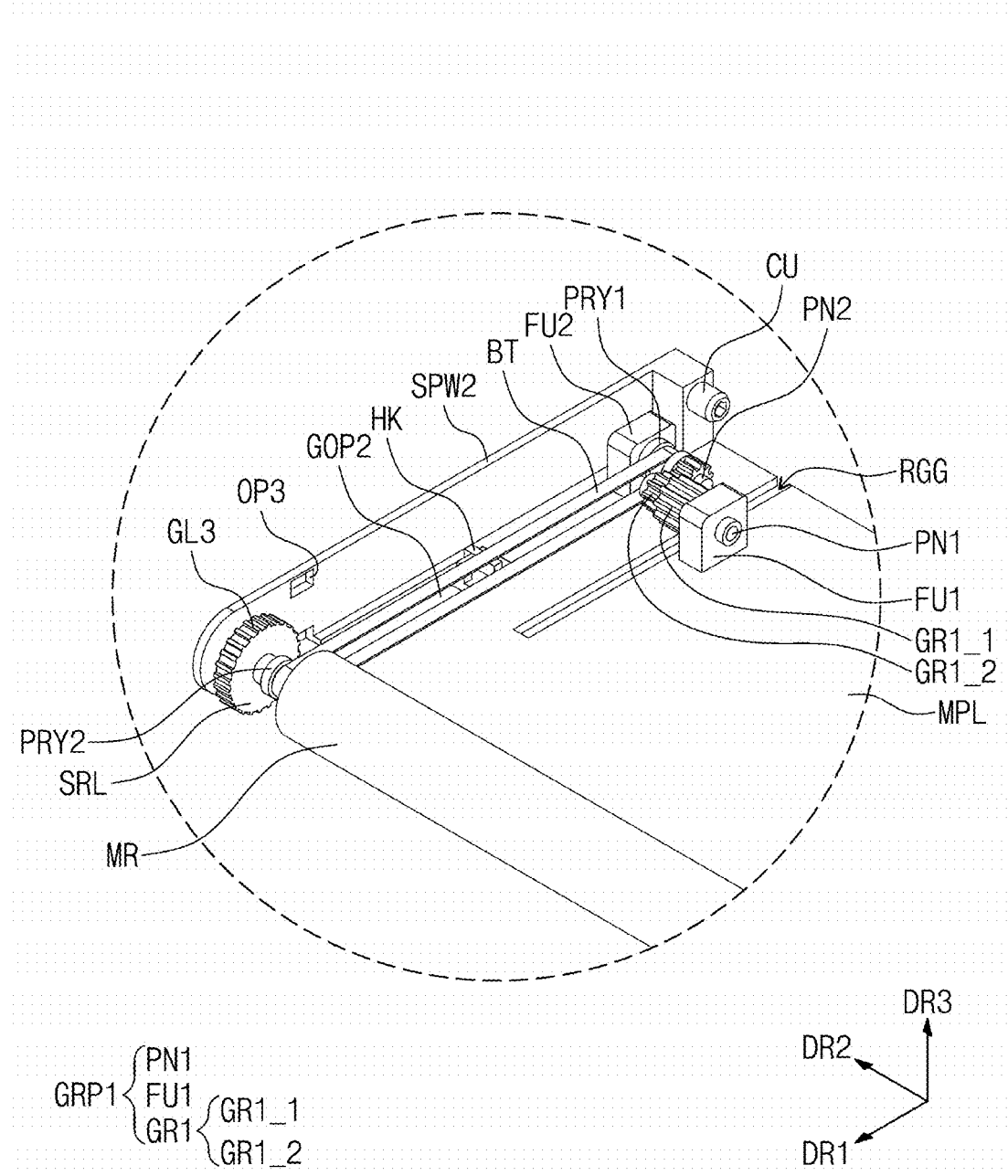
FIG. 19 is a view illustrating a connection relationship between the expansion module and the roller module shown in FIG. 15.
Figure 20A:
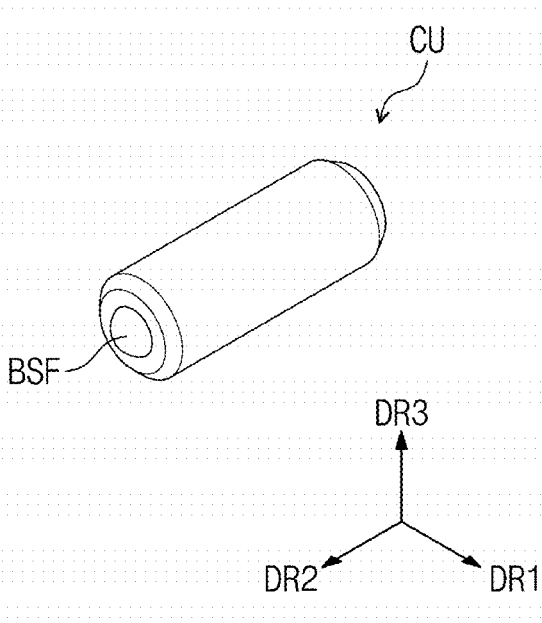
FIGS. 20A and 20B are views of the control units shown in FIG. 15.
Figure 20B:
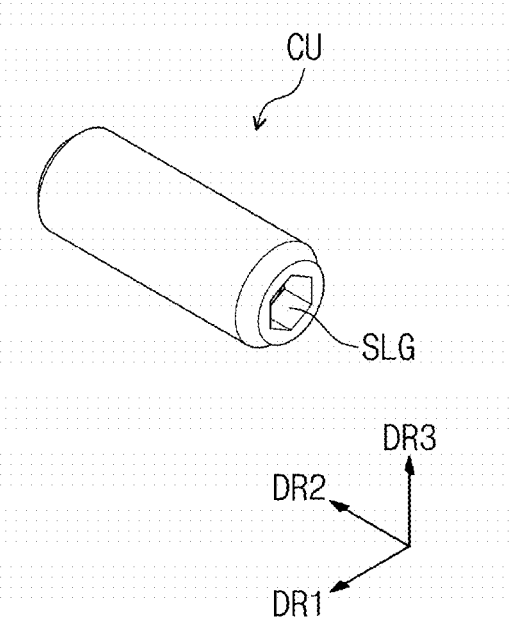
Figure 21:
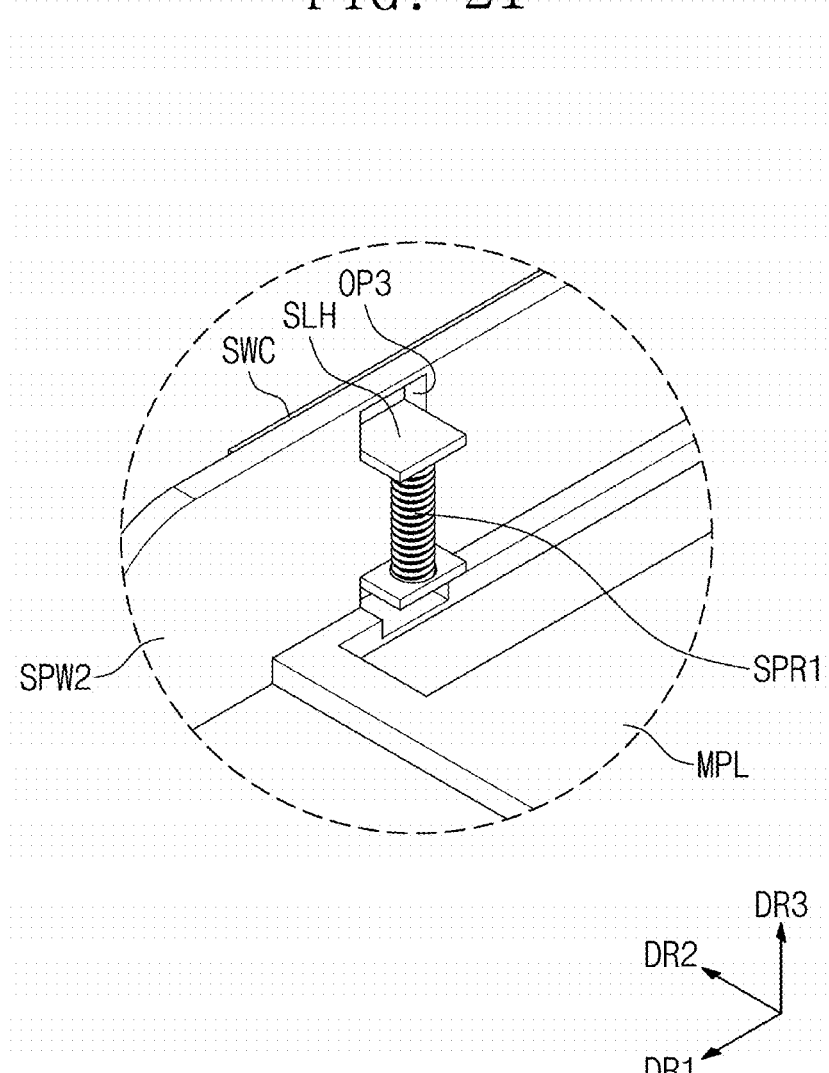
FIG. 21 is a view illustrating a connection relationship between the moving plate and the sidewall cases shown in FIG. 15.

FIG. 15 is an exploded perspective view of the moving plate MPL, the control units CU, the expansion module EMD, the sub-plate SUP, and the roller module RMD. FIGS. 16A and 16B are enlarged views of the moving plate MPL shown in FIG. 15. FIG. 17 is an enlarged view of the expansion module EMD, the control unit CU, and the moving plate MPL shown in FIG. 15. FIG. 18 is a view of the roller module RMD shown in FIG. 15. FIG. 19 is a view illustrating the connection relationship between the expansion module EMD and the roller module RMD in FIG. 15. FIGS. 20A and 20B are views of the control units CU shown in FIG. 15. FIG. 21 is a view illustrating the connection relationship between the moving plate MPL and the sidewall cases SWC shown in FIG. 15.

In FIG. 19, the sub-plate SUP is omitted.

In FIG. 21, the sub-plate SUP, the expansion module EMD, and the roller module RMD are omitted.

Referring to FIGS. 15, 16A, and 16B, second guide openings GOP2 may be defined through the second bottom portion BP2 to be adjacent to both sides of the second bottom portion BP2, which are opposite to each other in the second direction DR2. Each of the second guide openings GOP2 may extend in the first direction DR1.

The second bottom portion BP2 can comprise rail guide grooves RGG that may be defined through the second bottom portion BP2 and may extend from one side of both sides of the second bottom portion BP2, which are opposite to each other in the first direction DR1, toward the other side of the both sides of the second bottom portion BP2 in the first direction DR1. The rail guide grooves RGG may be defined between the second guide openings GOP2. Each of the rails RL of FIG. 13 may be disposed in a corresponding rail guide groove RGG of the rail guide grooves RGG. The rails RL may move in the first direction DR1 along the rail guide grooves RGG.

First openings OP1 may be defined through an upper surface of the second bottom portion BP2. The first openings OP1 may be defined between the rail guide grooves RGG. The first openings OP1 may have a circular shape in a plan view.

Second openings OP2 may be defined through the second sidewall portions SPW2 to be adjacent to the one side of the both sides of each of the second sidewall portions SPW2, which are opposite to each other in the first direction DR1. The second openings OP2 may have a circular shape in a plan view.

Control openings JHP may be defined through the second sidewall portions SPW2 to be adjacent to the other side of the both sides of each of the second sidewall portions SPW2, which are opposite to each other in the first direction DR1. The control openings JHP may extend in the second direction DR2. Although not shown in figures, screw threads may be defined in the control openings JHP. Screw valleys may be defined between the screw threads adjacent to each other.

Third openings OP3 may be defined through the second sidewall portions SPW2. The third openings OP3 may be defined between the second openings OP2 and the control openings JHP. A pair of the third openings OP3 may be arranged in the third direction DR3. The other pair of the third openings OP3 may be arranged in the third direction DR3. Viewing the second sidewall portions SPW2 in the second direction DR2, the second openings OP2, the third openings OP3, and the control openings JHP may be sequentially arranged.

The moving plate MPL may include connection portions HK and guide protrusions GDH. The connection portions HK may be disposed in the second guide openings GOP2. The connection portions HK may be disposed spaced apart from the other side of the both sides of the second bottom portion BP2, which are opposite to each other in the first direction DR1. As an example, the connection portions HK and the moving plate MPL may be integral with each other, however, the disclosure should not be limited thereto or thereby. According to an embodiment, the connection portions HK may be attached to the moving plate MPL by a welding process after being manufactured separately from the moving plate MPL.

The connection portions HK may include a connection body portion HKB and a hook portion HKK. The hook portion HKK may extend in the third direction DR3 and the first direction DR1 with respect to the connection body portion HKB. The hook portion HKK viewed in the second direction DR2 may have an upside down L shape.

The guide protrusions GDH may be disposed on outer side surfaces of the second sidewall portions SPW2, which are opposite to the inner side surfaces, which face each other, of the second sidewall portions SPW2. The guide protrusions GDH may extend in the first direction DR1. As an example, one guide protrusion GDH of the guide protrusions GDH is shown in FIG. 16B, and the other guide protrusion GDH may be substantially the same as the one guide protrusion GDH. The guide protrusions GDH may be disposed in the guide grooves GG shown in FIG. 13. The guide protrusions GDH may be movable in the first direction DR1 along the guide grooves GG.

Referring to FIGS. 15 and 17, the expansion module EMD may be disposed on the second bottom portion BP2. The expansion module EMD may be disposed adjacent to the rail guide groove RGG.

The expansion module EMD may include a pair of first gear portions GRP1, a pair of second gear portions GRP2, and a pair of belts BT. The first gear portions GRP1 may be disposed spaced apart from each other in the second direction DR2. Each of the first gear portions GRP1 may be disposed adjacent to a corresponding rail guide groove RGG of the rail guide grooves RGG.

The second gear portions GRP2 may be disposed spaced apart from each other in the second direction DR2. Each of the second gear portions GRP2 may be disposed adjacent to a corresponding rail guide groove RGG of the rail guide grooves RGG.

The first gear portions GRP1 may be substantially the same as each other. The second gear portions GRP2 may be substantially the same as each other. Hereinafter, for the convenience of explanation, one first gear portion GRP1 and one second gear portion GRP2 of the first and second gear portions GPR1 and GRP2 will be described in detail.

The first gear portion GRP1 may include a first-first gear GR1_1, a first-second gear GR1_2, a first fixing unit FU1, and a first fixing pin PN1. The first fixing unit FU1 may be disposed adjacent to the rail guide groove RGG. The first fixing unit FU1 in a plan view may have a quadrangular shape.

The first-first gear GR1_1 may be disposed at one side of both sides of the first fixing unit FU1, which are opposite to each other in the second direction DR2. The one side of the first fixing unit FU1 may face the rail guide groove RGG. The first-first gear GR1_1 may overlap the rail guide groove RGG in the thickness direction DR3. The first-first gear GR1_1 may include first-first protrusions GL1_1.

The first-second gear GR1_2 may be disposed at one side of both sides of the first-first gear GR1_1, which are opposite to each other in the second direction DR2. The other side of the first-first gear GR1_1 may face the one side of the first fixing unit FU1. The first fixing unit FU1, the first-first gear GR1_1, and the first-second gear GR1_2 may be arranged in the second direction DR2.

The first-second gear GR1_2 may have a size smaller than a size of the first-first gear GR1_1. The first-second gear GR1_2 may include first-second protrusions GL1_2.

Although not shown in figures, openings viewed in the second direction DR2 may be defined through the first fixing unit FU1, the first-first gear GR1_1, and the first-second gear GR1_2. The first fixing pin PN1 may be disposed in the openings. The first fixing pin PN1 may penetrate through the first fixing unit FU1, the first-first gear GR1_1, and the first-second gear GR1_2. The first fixing pin PN1, the first-first gear GR1_1, and the first-second gear GR1_2 may be extended to each other. The first fixing pin PN1, the first-first gear GR1_1, and the first-second gear GR1_2 may be rotatably coupled to the first fixing unit FU1. The first fixing pin PN1, the first-first gear GR1_1, and the first-second gear GR1_2 may be rotatable with respect to a first rotational axis RX1 substantially parallel to the second direction DR2.

The second gear portion GRP2 may include a second gear GR2, a first pulley part PRY1, and a second fixing unit FU2. The second fixing unit FU2 may be disposed adjacent to the second sidewall portion SPW2. The second fixing unit FU2 in a plan view may have a quadrangular shape.

The first pulley part PRY1 may be disposed at one side of both sides of the second fixing unit FU2, which are opposite to each other in the second direction DR2. The one side of the second fixing unit FU2 may be opposite to the other side of the second fixing unit FU2, which faces the second sidewall portion SPW2. The first pulley part PRY1 viewed the second direction DR2 may have a circular shape.

The belt BT may be disposed along an outer surface of the first pulley part PRY1. The belt BT may connect the first pulley part PRY1 to a second pulley part PRY2 that is described with reference to FIGS. 18 and 19. The connection relationship between the first pulley part PRY1 and the roller module RMD will be described in detail with reference to FIG. 19.

The second gear GR2 may be disposed at one side of both sides of the first pulley part RPY1, which are opposite to each other in the second direction DR2. The one side of the first pulley part PRY1 may be opposite to the other side of the first pulley part PRY1, which faces the second fixing unit FU2. The second gear GR2 may include second protrusions GL2. The second protrusions GL2 may be engaged with the first-second protrusions GL1_2 of the first-second gear GR1_2 and may rotate with the first-second protrusions GL1_2 of the first-second gear GR1_2. As an example, the second gear GR2 may rotate in a direction opposite to a rotation direction of the first-second gear GR1_2.

Although not shown in figures, openings viewed in the second direction DR2 may be defined through the second fixing unit FU2, the second gear GR2, and the first pulley part PRY1. A second fixing pin PN2 may be disposed in the openings. The second fixing pin PN2 may penetrate through the second fixing unit FU2, the second gear GR2, and the first pulley part PRY1. The first pulley part PRY1, the second gear GR2, and the second fixing pin PN2 may be extended to each other. The second fixing pin PN2, the second gear GR2, and the first pulley part PRY1 may be rotatably coupled to the second fixing unit FU2. The second fixing pin PN2, the second gear GR2, and the first pulley part PRY1 may rotate with respect to a second rotational axis RX2 substantially parallel to the second direction DR2.

Referring to FIGS. 15 and 18, the roller module RMD may include a main roller MR, sub-rollers SRL, protrusion portions HP, and second pulley parts PRY2.

The main roller MR may extend in the second direction DR2. The main roller MR may have a cylindrical shape. As an example, the main roller MR shown in FIGS. 18 and 19 does not include protrusions, however, the protrusions may be provided on an outer surface of the main roller MR. In this case, the main roller MR may have a gear shape. The main roller MR may comprise first and second main roller sides that are opposite to each other in the second direction DR2.

The second pulley parts PRY2 may be disposed at both of the first and second main roller sides of the main roller MR, which are opposite to each other in the second direction DR2. The second pulley parts PRY2 may have substantially the same shape as that of the first pulley parts PRY1.

The sub-rollers SRL may be disposed at both of the first and second main roller sides of the main roller MR, which are opposite to each other in the second direction DR2. The sub-rollers SRL may be disposed at one side of both sides of the second pulley parts PRY2, which are opposite to each other in the second direction DR2. The one side of the second pulley parts PRY2 may be opposite to the other side of the second pulley parts PRY2, which faces the main roller MR.

The sub-rollers SRL may have a gear shape. As an example, the sub-rollers may include third protrusions GL3 arranged on an outer surface of the sub-rollers and protruded outwardly from the sub-rollers.

The protrusion portions HP may be disposed at the both sides of the main roller MR, which are opposite to each other in the second direction DR2. The protrusion portions HP may be disposed at one side of both sides of each of the sub-rollers SRL, which are opposite to each other in the second direction DR2. The one side of the sub-rollers SRL may be opposite to the other side of the sub-rollers SRL, which faces the one side of the second pulley parts PRY2.

Referring to FIGS. 15 and 19, the roller module RMD may be coupled to the moving plate MPL. The roller module RMD may be coupled to the second sidewall portions SPW2. One of the protrusion portions HP of the roller module RMD may be disposed in the second opening OP2 defined through the second sidewall portion SPW2. Hereinafter, for the convenience of explanation, descriptions are made based on one first gear portion GRP1, one second gear portion GRP2, one belt BT, one second pulley part PRY2, and one sub-roller SRL, and details of the other first gear portion GRP1, the other second gear portion GRP2, the other belt BT, the other second pulley part PRY2, and the other sub-roller SRL will be omitted.

The roller module RMD may be extended to the expansion module EMD. The belt BT disposed along the outer surface of the first pulley part PRY1 may be extended to the second pulley part RPY2. In case that the first pulley part PRY1 rotates, the second pulley part PRY2 may rotate. Accordingly, in case that the first-first gear GR1_1 and the first-second gear GR1_2 rotate with respect to the first rotational axis RX1, the second gear GR2 and the first pulley part PRY1, which are engaged with the first-second gear GR1_2, may rotate with respect to the second rotational axis RX2. In case that the first pulley part PRY1 rotates, the second pulley part PRY2 extended to the first pulley part PRY1 by the belt BT may respond by rotating with respect to a rotational axis parallel to the second direction DR2. Accordingly, a rotational force of the second gear portion GRP2 may be applied by the belt BT to the roller module RMD. The main roller MR and the sub-roller SRL may rotate with respect to a rotational axis parallel to the second direction DR2.

Referring to FIGS. 15, 17, 20A, and 20B, the control units CU in a plan view may have a cylindrical shape. One side of both sides of the control unit CU, which are opposite to each other in the second direction DR2, may have a semi-circular shape BSF. Although not shown in figures, an elastic member may be disposed in the control unit CU. The elastic member may be extended to the one side of the control unit CU, which has the semi-circular shape. Accordingly, the semi-circular shape may move back and forth in the second direction DR2.

As an example, a hexagonal wrench groove SLG viewed in the second direction DR2 may be defined in the other side of the control unit CU, however, the shape of the wrench groove SLG should not be limited thereto or thereby. The one side of the both sides of the control unit CU, which are opposite to each other in the second direction DR2, may face the second sidewall portion SPW2.

As an example, the control unit CU shown in FIGS. 20A and 20B does not include screw threads, however, the control unit CU may include the screw threads. The screw threads may be disposed on the outer surface of the control unit CU between the one side and the other side of the control unit CU.

As shown in FIGS. 15 and 17, the control unit CU may be disposed in the control openings JHP of the moving plate MPL. The control unit CU may be provided in plural. The control units CU may be spaced apart from each other in the second direction DR2 and may be disposed in the control openings JHP of the moving plate MPL. Since the control units CU are the same as each other, hereinafter, for the convenience of explanation, descriptions are made based on one control unit CU and one control opening JHP.

The control unit CU may be disposed in the control opening JHP. As an example, in case that a wrench (not shown) is inserted into the wrench groove SLG defined in the other side of the control unit CU and rotates with respect to the rotational axis parallel to the second direction DR2, the control unit CU may be fixed to the control opening JHP.

Referring to FIGS. 15 and 21, the sidewall cases SWC may include sidewall protrusion portions SLH. The sidewall protrusion portions SLH may be disposed at one side of both sides of the sidewall cases SWC, which are opposite to each other in the second direction DR2. The one side of the both sides of the sidewall cases SWC, which are opposite to each other in the second direction DR2, may be defined as the sides facing each other in the second direction DR2. The sidewall protrusion portions SLH may extend from the sidewall cases SWC to the second direction DR2. The sidewall protrusion portions SLH viewed in the second direction DR2 may have a quadrangular shape.

The sidewall cases SWC may be coupled to the second sidewall portion SPW2 of the moving plate MPL. Each of the sidewall protrusion portions SLH may be disposed in a corresponding third opening OP3 among the third openings OP3. A thickness in the third direction DR3 of the sidewall protrusion portions SLH may be smaller than a thickness in the third direction DR3 of the third openings OP3. Accordingly, the sidewall protrusion portions SLH may move in the third direction DR3 along the third openings OP3.

A first elastic member SPR1 may be disposed between the sidewall protrusion portions SLH arranged in the third direction DR3. The sidewall cases SWC arranged in the third direction DR3 may be movable away from or toward each other in the third direction by the first elastic member SPR1.

Figure 22A:
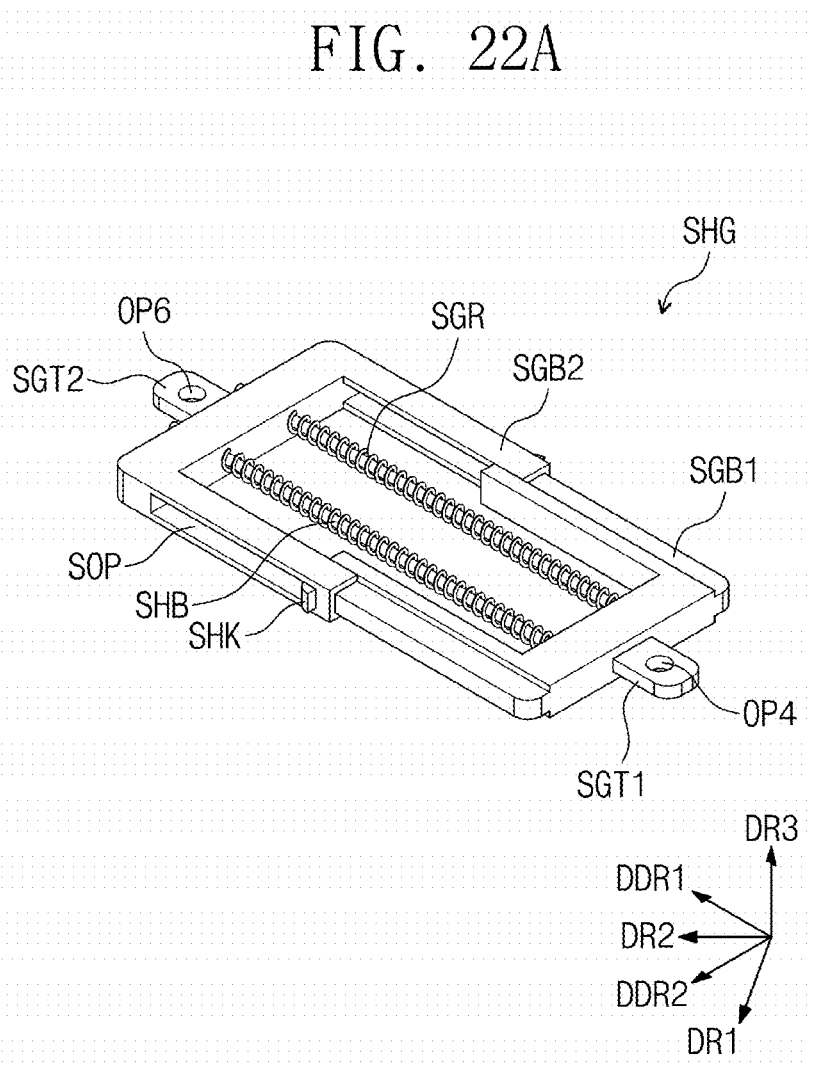
FIG. 22A is a perspective view of the sliding hinge shown in FIG. 13.
Figure 22B:
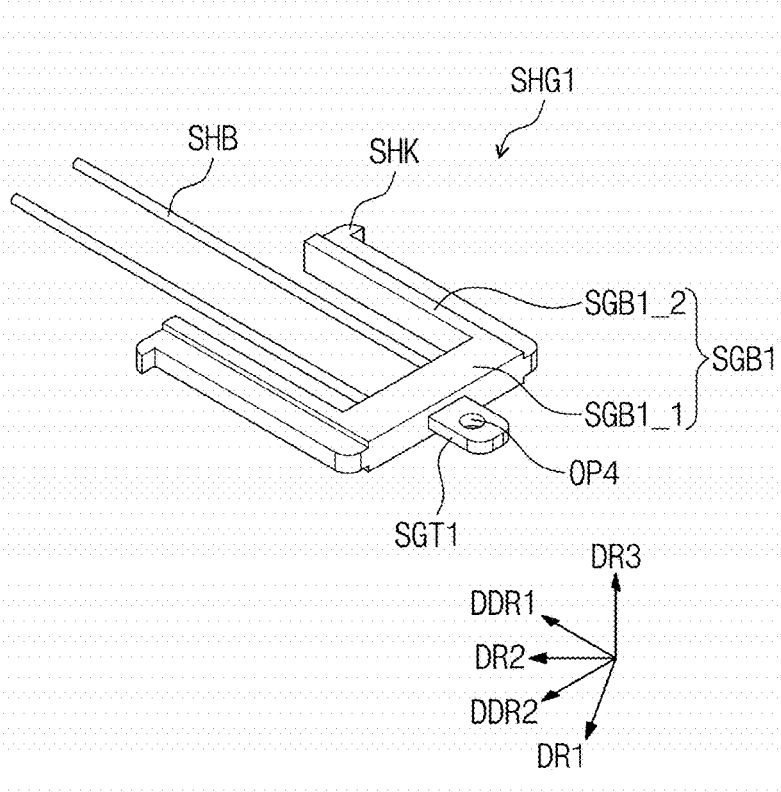
FIG. 22B is a perspective view of a first hinge shown in FIG. 22A.
Figure 22C:
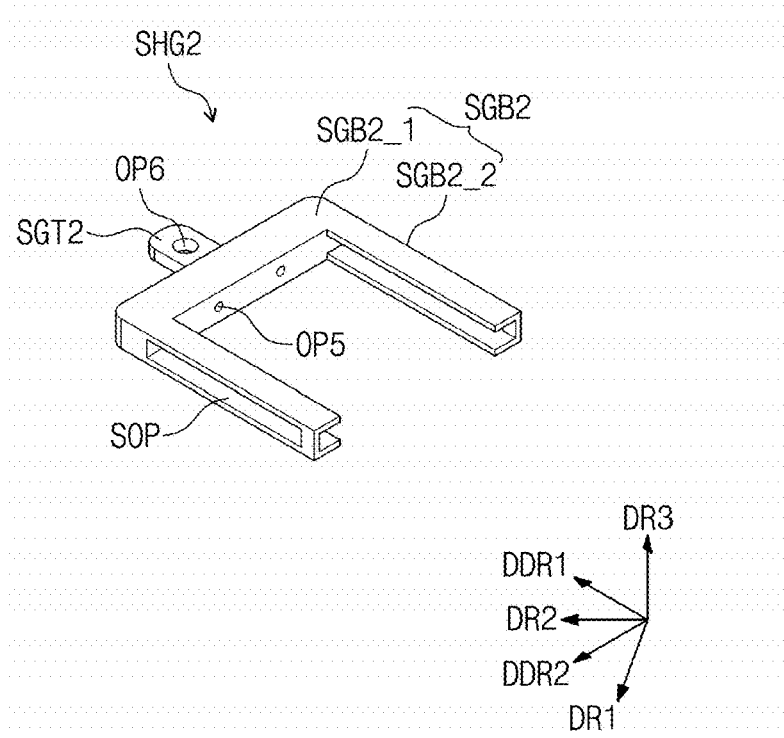
FIG. 22C is a perspective view of a second hinge shown in FIG. 22A.

FIG. 22A is a perspective view of the sliding hinge SHG shown in FIG. 13. FIG. 22B is a perspective view of a first hinge SHG1 shown in FIG. 22A. FIG. 22C is a perspective view of a second hinge SHG2 shown in FIG. 22A.

Referring to FIGS. 22A, 22B, and 22C, the sliding hinge SHG may include a coupling elastic member SGR, the first hinge SHG1, and the second hinge SHG2. The first hinge SHG1 may include a first hinge body SGB1, a first hinge protrusion portion SGT1, hinge bars SHB, and hinge hooks SHK.

The first hinge body SGB1 may include a first-first hinge body SGB1_1 and first-second hinge bodies SGB1_2. The first-first hinge body SGB1_1 may extend in a second diagonal direction DDR2. The first-second hinge bodies SGB1_2 may be disposed at both ends of the first-first hinge body SGB1_1, which are opposite to each other in a second diagonal direction DDR2. The first-second hinge bodies SGB1_2 may extend from the both sides of the first-first hinge body SGB1_1 to the first diagonal direction DDR1. The first diagonal direction DDR1 may cross the first and second directions DR1 and DR2 on a plane defined by the first direction DR1 and the second direction DR2. The second diagonal direction DDR2 may cross the first diagonal direction DDR1.

The hinge hooks SHK may be disposed adjacent to one sides of the first-second hinge bodies SGB1_2. The one sides of the first-second hinge bodies SGB1_2 may be opposite to the other sides of the first-second hinge bodies SGB1_2, which are adjacent to the first-first hinge body. The other sides of the first-second hinge bodies SGB1_2 may be disposed at the both sides of the first-first hinge body and may be integral with the both ends of the first-first hinge body. The hinge hooks SHK may extend in the second diagonal direction DDR2.

The hinge bars SHB may be disposed at one side of both sides of the first-first hinge body SGB1_1, which are opposite to each other in the first diagonal direction DDR1. The one side of the both sides of the first-first hinge body SGB1_1, which are opposite to each other in the first diagonal direction DDR1, may face the second hinge SHG2. The hinge bars SHB may be disposed spaced apart from each other in the second diagonal direction DDR2. The hinge bars SHB may extend from the first-first hinge body SGB1_1 to the first diagonal direction DDR1. The hinge bars SHB may have a cylindrical shape. The coupling elastic member SGR may be provided in plural, and the coupling elastic members SGR may be disposed on the hinge bars SHB.

The first hinge protrusion portion SGT1 may be disposed at the other side of the both sides of the first-first hinge body SGB1_1, which are opposite to each other in the first diagonal direction DDR1. The first hinge protrusion portion SGT1 may be provided with a fourth opening OP4 defined therethrough.

The second hinge may include a second hinge body SGB2 and a second hinge protrusion portion SGT2. The second hinge body SGB2 may include a second-first hinge body SGB2_1 and second-second hinge bodies SGB2_2. The second-first hinge body SGB2_1 may extend in the second diagonal direction DDR2.

Fifth openings OP5 may be defined through the second-first hinge body SGB2_1. The fifth openings OP5 may be defined spaced apart from each other in the second diagonal direction DDR2.

The second hinge protrusion portion SGT2 may be disposed at the other side of both sides of the second-first hinge body SGB2_1, which are opposite to each other in the first diagonal direction DDR1. The sixth opening OP6 may be defined through the second hinge protrusion portion SGT2.

The second-second hinge bodies SGB2_2 may be disposed at both sides of the second-first hinge body SGB2_1, which are opposite to each other in the second diagonal direction DDR2. The second-second hinge bodies SGB2_2 may extend from the both sides of the second-first hinge body SGB2_1 to the first diagonal direction DDR1.

Accommodation openings SOP may be defined through each of the second-second hinge bodies SGB2_2. The accommodation openings SOP viewed in the second diagonal direction DDR2 may have a quadrangular shape. The accommodation openings SOP may extend in the first diagonal direction DDR1.

The first hinge SHG1 and the second hinge SHG2 may be coupled to each other. The first hinge body SGB1 and the second hinge body SGB2 may face each other. Each of the hinge bars SHB disposed on the first hinge body SGB1 may be inserted in to a corresponding fifth opening OP5 of the fifth openings OP5 defined through the second hinge body SGB2. Each of the hinge hooks SHK disposed on the first hinge body SGB1 may be slidably coupled to a corresponding accommodation opening SOP of the accommodation openings SOP defined through the second hinge body SGB2. The coupling elastic member SGR may be disposed between the first hinge SHG1 and the second hinge SHG2. The coupling elastic member SGR can cause a change in a distance between the first hinge SHG1 and the second hinge SHG2; for example, the coupling elastic member SGR may cause the distance between the first hinge SHG1 and the second hinge SHG2 to increase or decrease.

Figure 23:
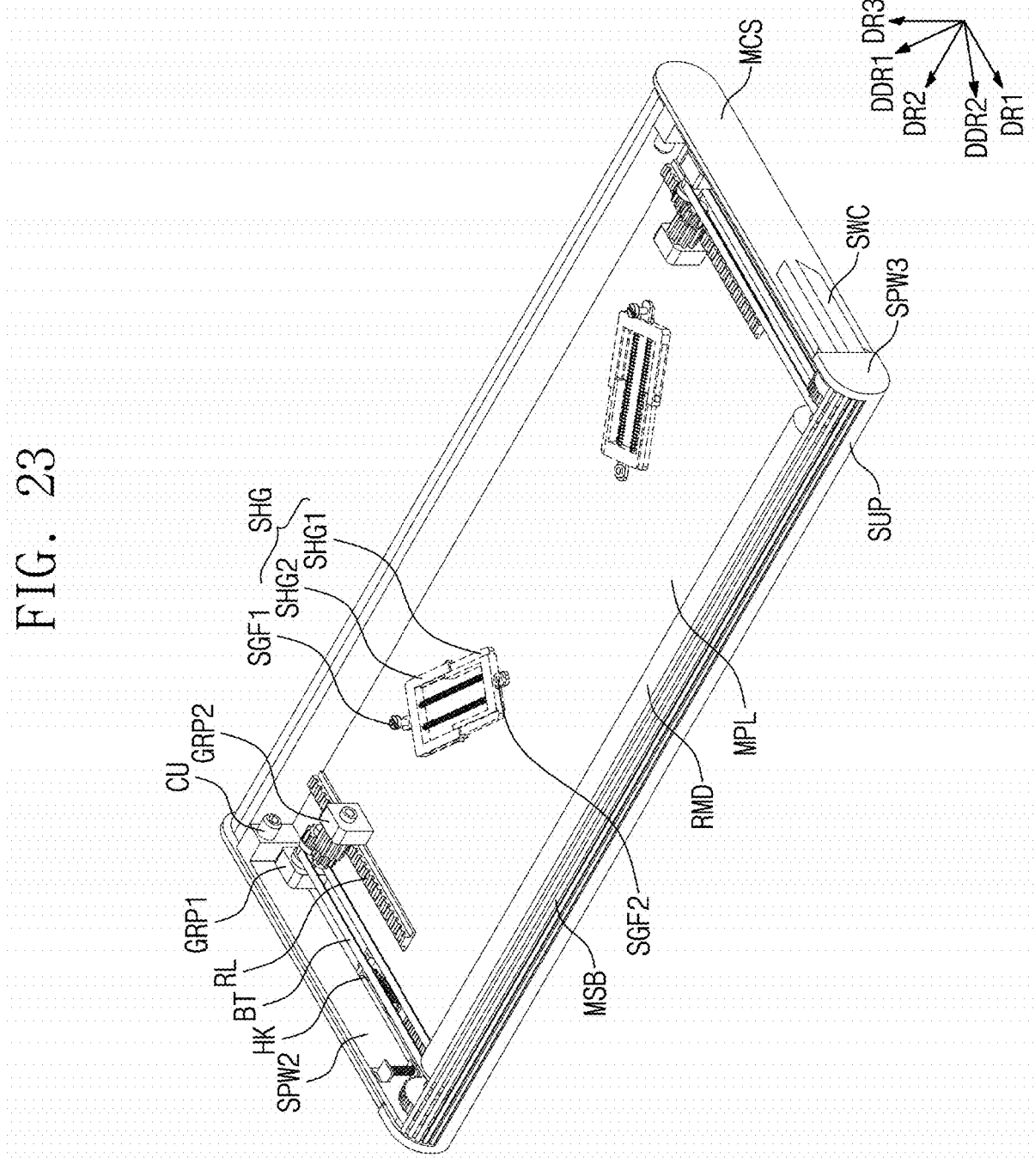
FIG. 23 is a perspective view of the sliding hinges, the expansion module, the roller module, the main case, the moving plate, and the support plate in the contraction configuration.
Figure 24:
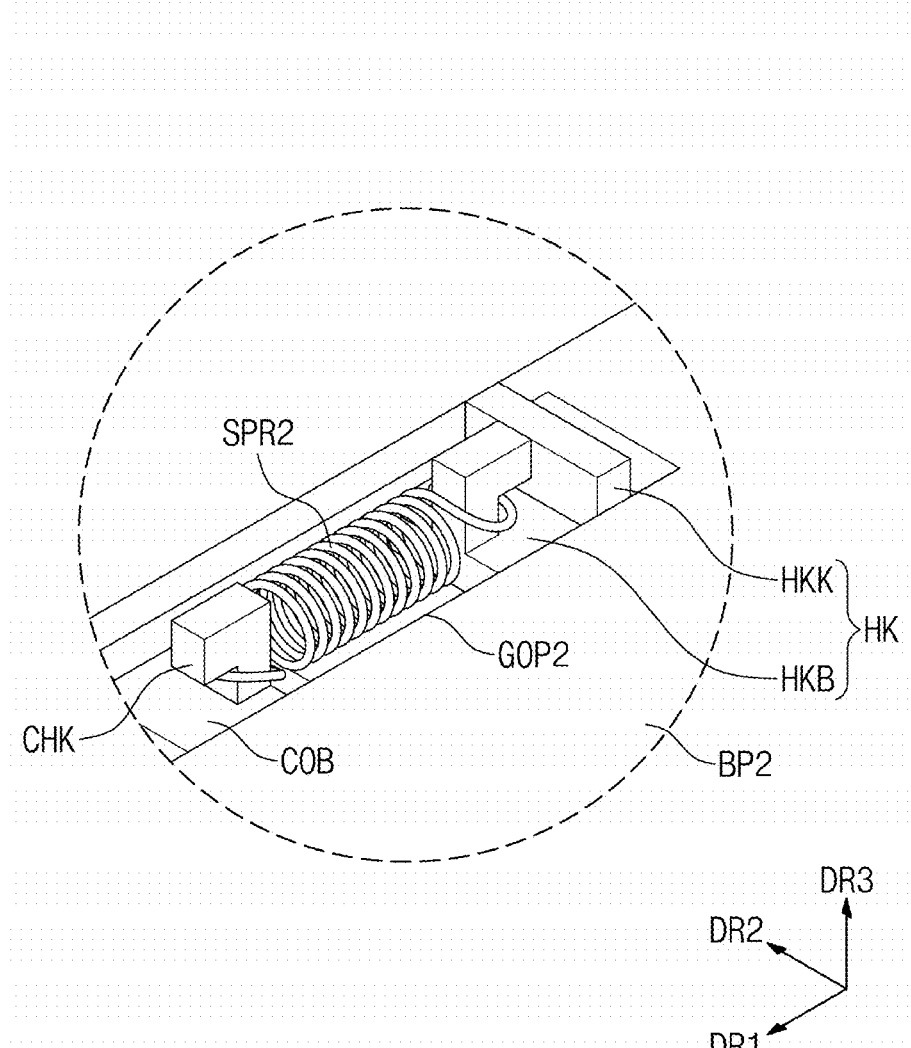
FIG. 24 is an enlarged view of a coupling part and a connection portion shown in FIG. 23.
Figure 25:
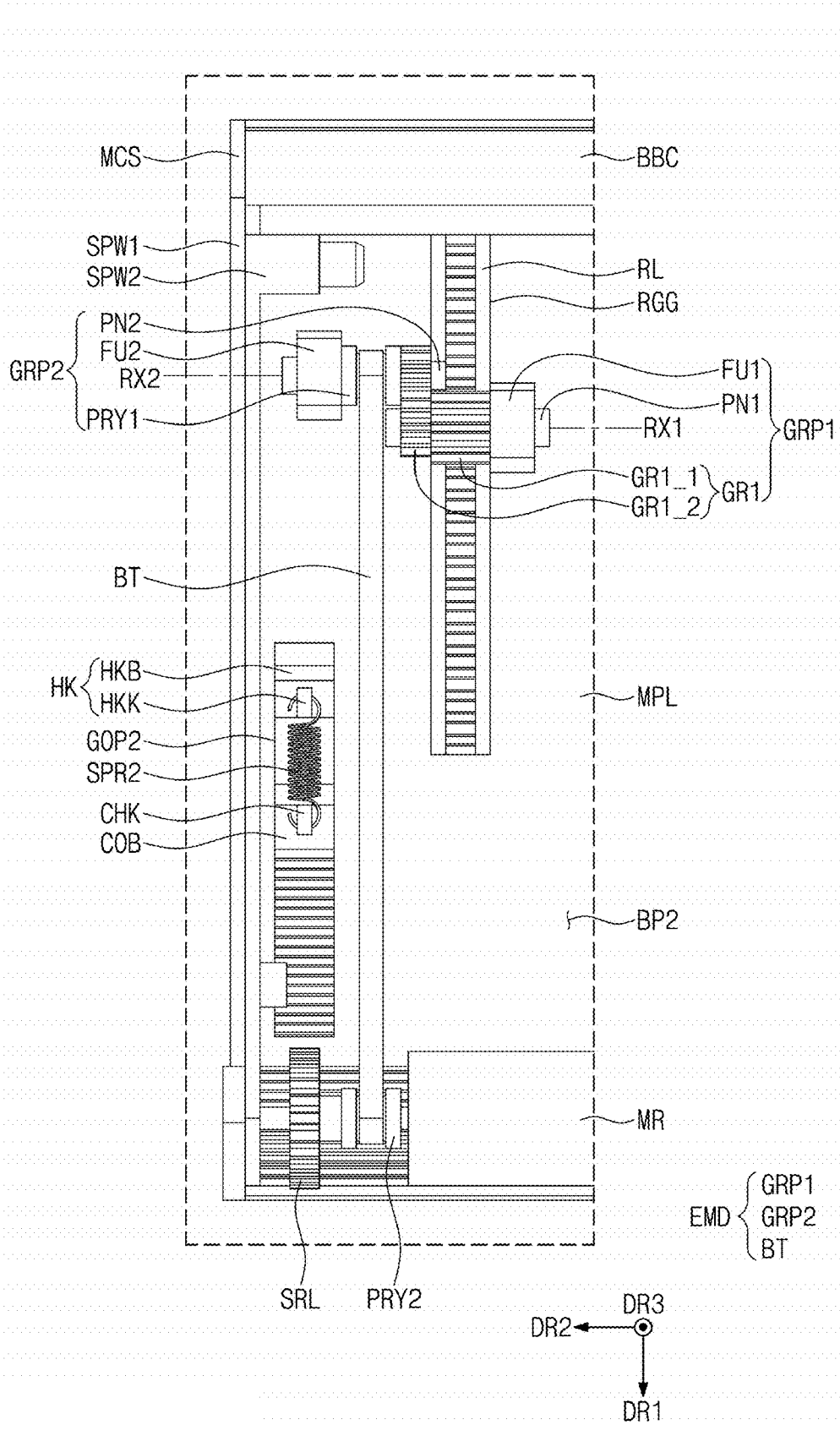
FIG. 25 is a plan view of the expansion module shown in FIG. 23.

FIG. 23 is a perspective view of the sliding hinges SHG, the expansion module EMD, the roller module RMD, the main case MCS, the moving plate MPL, and the support plate MTP in the contraction configuration. FIG. 24 is an enlarged view of the coupling part CHK and the connection portion HK shown in FIG. 23. FIG. 25 is a plan view of the expansion module EMD shown in FIG. 23.

As an example, the moving plate MPL may be constructed and arranged to move in a second movement direction toward the main case MCS in the contraction configuration.

For the convenience of explanation, the main sidewall covers MRC, the plate PLA of the support plate MTP, and some support bars MSB are omitted in FIGS. 23 to 26.

FIG. 24 is an enlarged view of one of the coupling parts CHK and one of the connection portions HK. FIG. 25 shows one first gear portion GRP1 and one second gear portion GRP2 of the first and second gear portions GRP1 and GRP2. A rail RL of the rails RL and a belt BT of the belts BT are shown in FIG. 25.

In FIGS. 23 to 25, details of the same elements, e.g., the expansion module EMD, the sliding hinges SHG, the roller module RMD, the main case MCS, the moving plate MPL, and the support plate MTP, as those described with reference to FIGS. 3 to 22 will be omitted or briefly mentioned.

Referring to FIGS. 23 and 24, the sub-plate SUP may be disposed under the moving plate MPL and the roller module RMD. The second sidewall portions SPW2 may be disposed between the third sidewall portions SPW3. Each of the second sidewall portions SPW2 may be attached to a corresponding third sidewall portion SPW3 of the third sidewall portions SPW3. Accordingly, the sub-plate SUP, the moving plate MPL, and the roller module RMD may be extended to each other.

Some support bars MSB among the support bars MSB may be disposed between the moving plate MPL and the sub-plate SUP. The coupling support bar COB shown in FIG. 10 may be arranged in the first direction DR1 between the moving plate MPL and the sub-plate SUP.

The other support bars MSB among the support bars MSB may be arranged in a curved shape along outer surfaces of the main roller MR and the sub-rollers SRL. The one side of the sub-plate SUP, which has the curved shape, may cover the support bars MSB disposed on the outer surface of the main roller MR.

Each of the coupling parts CHK disposed on the coupling support bar COB may be inserted into a corresponding second guide opening GOP2 of the second guide openings GOP2 defined in the second bottom portion BP2. The support bars MSB may be coupled to the moving plate MPL.

The coupling parts CHK may move in the first direction DR1 along the second guide openings GOP2. As the coupling parts CHK move in the first direction DR1, the coupling support bar COB may be coupled to the second bottom portion BP2 and may move in the first direction DR1 along the second guide openings GOP2.

The connection portions HK may further include second elastic members SPR2. The coupling parts CHK may be extended to the connection portions HK by the second elastic member SPR2. The second elastic member SPR2 may provide an elasticity to the coupling parts CHK in a direction opposite to a direction in which the coupling parts CHK move. The coupling parts CHK may receive the elasticity provided in the direction opposite to the movement direction of the coupling parts CHK by the second elastic member SPR2. Accordingly, the support bars MSB may be maintained in the flat state.

In the case where the support plate MTP is not maintained in the flat state in case that the operation configuration of the display device DD shown in FIGS. 1 and 2 is changed from the contraction configuration to the expansion configuration, the expansion area DEP of the display module DM shown in FIG. 4 may be wrinkled.

However, according to the disclosure, the support plate MTP may receive the elasticity from the second elastic member SPR2. Accordingly, the support bars MSB may be maintained in the flat state, and the display panel DP may be prevented from being wrinkled. Thus, a surface quality of the display module DM may increase in the expansion configuration.

Referring to FIGS. 13, 23 and 25, the moving plate MPL may be disposed on the main case MCS. The second bottom portion BP2 may be disposed on the first bottom portion BP1. Each of the rails RL may be slidably coupled to a corresponding rail guide groove RGG of the rail guide grooves RGG defined in the second bottom portion BP2. The expansion module EMD may be disposed on the rails RL. Each of the first-first gears GR1_1 may be disposed on a corresponding rail RL of the rails RL.

The control units CU may be inserted into the control openings JHP defined through the second sidewall portions SPW2. The one sides of the control units CU shown in FIG. 20A may be in contact with the second sidewall portions SPW2. The one sides of the control units CU may be disposed in the first control grooves CUG1 shown in FIG. 14. As the control units CU are disposed in the first control grooves CUG1, the expansion module EMD may be maintained in the contraction configuration.

Figure 26:
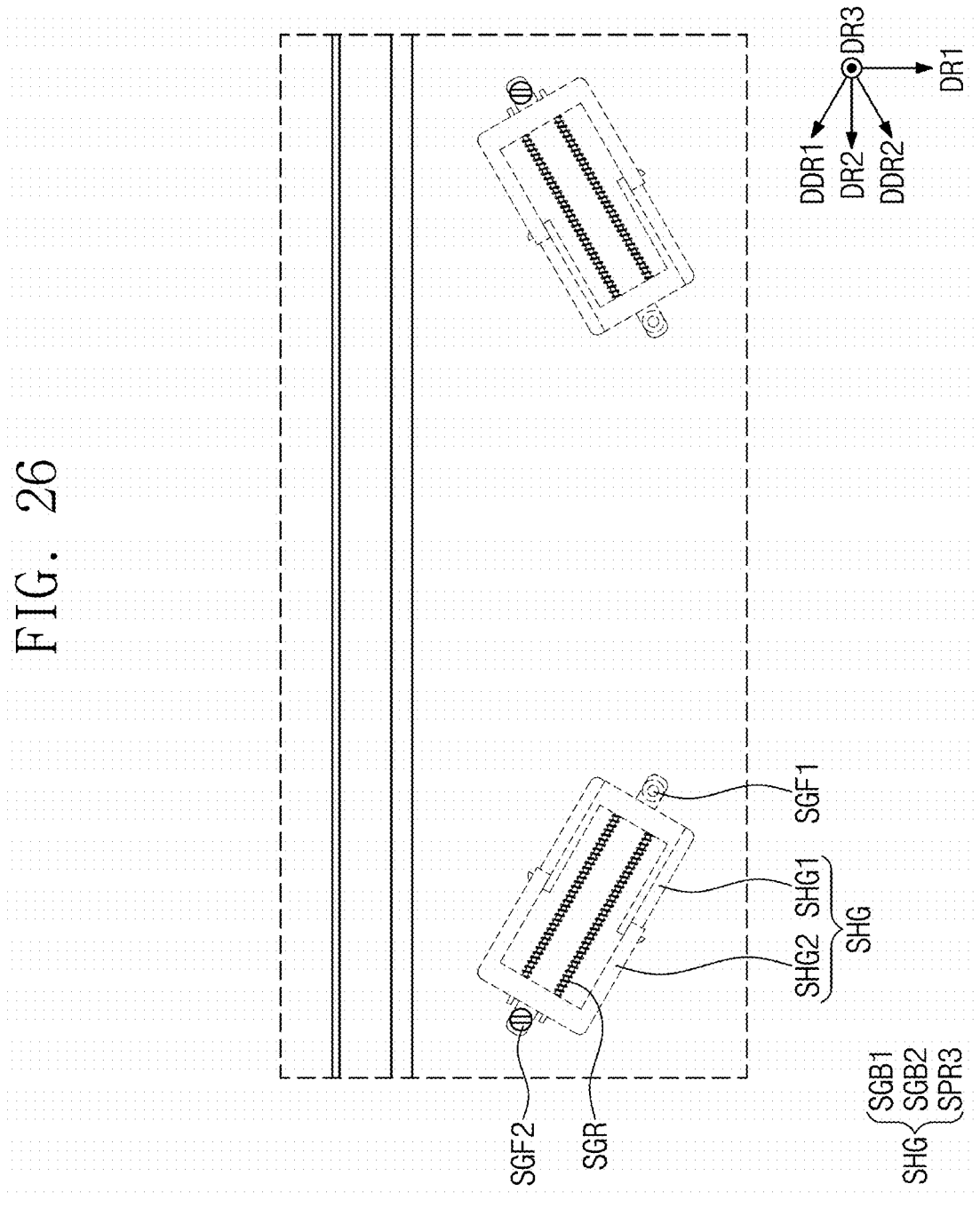
FIG. 26 is a plan view of the sliding hinges shown in FIG. 23.

Referring to FIGS. 22A, 23, and 26, the sliding hinges SHG may be disposed between the main case MCS and the moving plate MPL. In case that the display module DM shown in FIG. 1 is in the contraction configuration, the first hinge SHG1 and the second hinge SHG2 of one sliding hinge SHG of the sliding hinges SHG may be arranged in the first diagonal direction DDR1. The first hinge SHG1 and the second hinge SHG2 of the other sliding hinge SHG of the sliding hinges SHG may be arranged in the second diagonal direction DDR2. A distance between the first and second hinges SHG1 and SHG2 in one sliding hinge may be the greatest in the contraction configuration. A distance between the first hinges SHG1 spaced apart from each other in the second direction DR2 may be smaller than a distance between the second hinges SHG2 spaced apart from each other in the second direction DR2 in the contraction configuration.

The first hinge SHG1 may comprise a first side in which first hinge protrusion portion SGT1 and the fourth opening OP4 are disposed; hence, the first side of the first hinge SHG1 may be rotatably coupled to the main case MCS. The main openings MOP of the main case MCS shown FIG. 14 may overlap the fourth openings OP4 shown in FIG. 22A in the thickness direction DR3. Each of the first sliding fixing portions SGF1 may be inserted into a corresponding main opening MOP of the main openings MOP and a corresponding fourth opening OP4 of the first hinge SHG1.

The second hinge SHG2 may comprise a second side in which the second hinge protrusion portion SGT2 and the sixed opening OP6 are disposed; hence, the second side of the second hinge SHG2 may be rotatably coupled to the moving plate MPL. The first openings OP1 of FIG. 15 and the sixth openings OP6 of FIG. 22A of the respective sliding hinges SHG may overlap each other in the thickness direction DR3. Each of the second sliding fixing portions SGF2 may be inserted into a corresponding first opening OP1 of the first openings OP1 and a corresponding sixth opening OP6 of the sixth openings OP6. Accordingly, the main case MCS, the sliding hinges SHG, and the moving plate MPL may be extended to each other. Accordingly, the sliding hinges SHG may provide the elasticity in a second movement direction that enables the moving plate MPL and the main case MCS to move toward each other in the contraction configuration.

Figure 27:
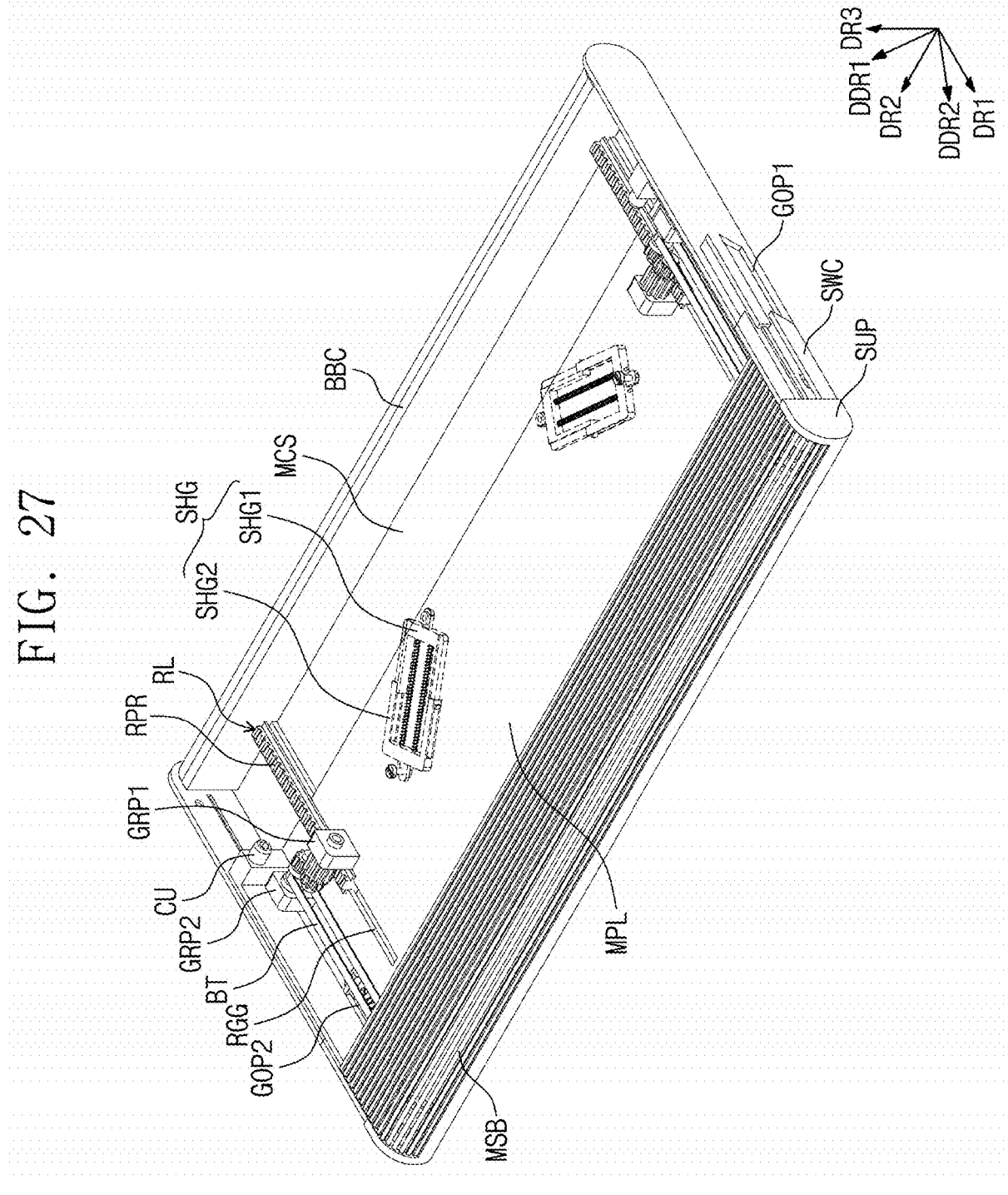
FIG. 27 is a perspective view of the sliding hinges, the expansion module, the roller module, the main case, the moving plate, and the support plate in the contraction configuration.
Figure 28:
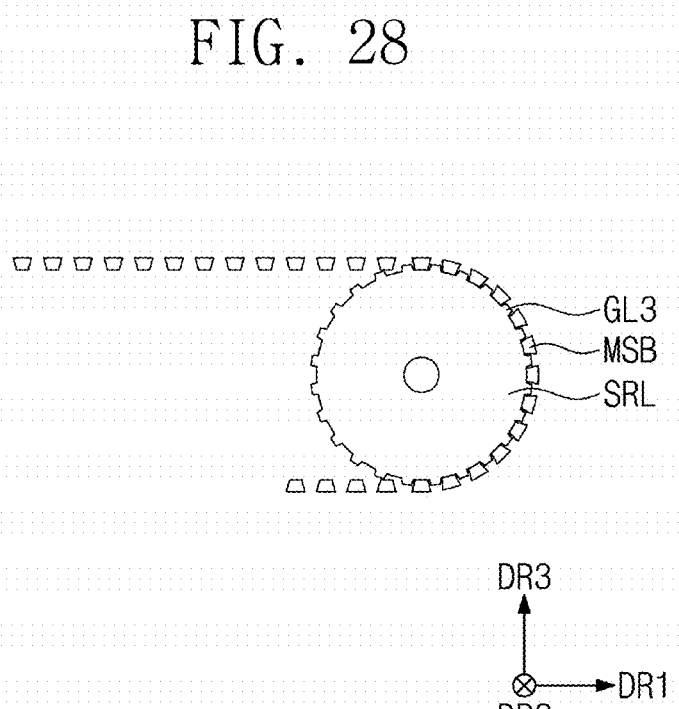
FIG. 28 is a view of a sub-roller and support bars shown in FIG. 27.
Figure 29:
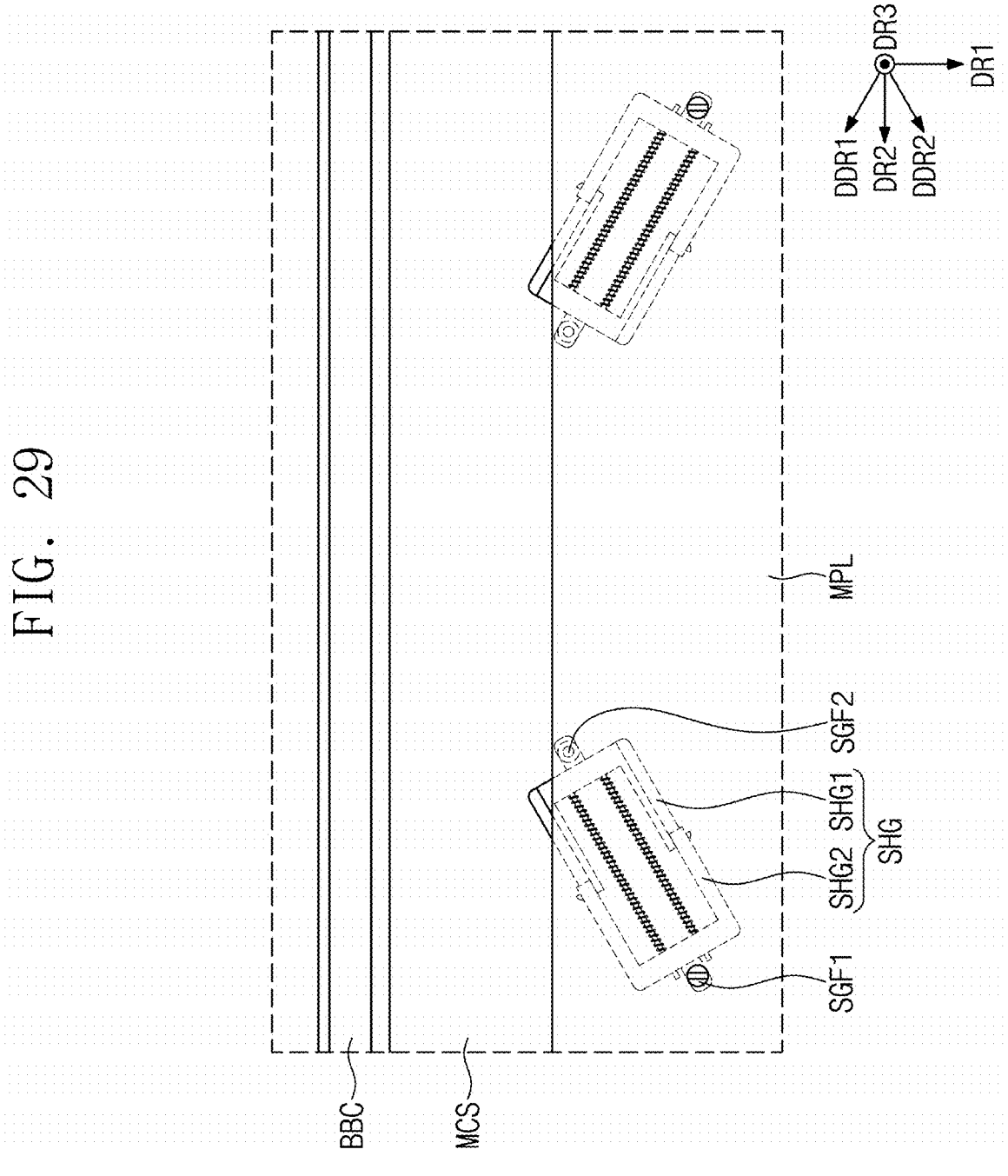
FIG. 29 is a plan view of the sliding hinges shown in FIG. 27.

FIG. 27 is a perspective view of the sliding hinges SHG, the expansion module EMD, the roller module RMD, the main case MCS, the moving plate MPL, and the support plate MTP in the contraction configuration. FIG. 28 is a view of the sub-roller SRL and the support bars MSB shown in FIG. 27. FIG. 29 is a plan view of the sliding hinges SHG shown in FIG. 27.

FIG. 28 shows the sub-roller SRL and the support bars MSB viewed in the second direction DR2.

In case that the display module DM is in the expansion configuration, the moving plate MPL may be constructed and arranged to move in a first movement direction to be away from the main case MCS. In case that the display module DM is in the contraction configuration, an area where the moving plate MPL overlaps the main case MCS in the thickness direction DR3 may be greater than an area where the moving plate MPL overlaps the main case MCS in the thickness direction DR3 in case that the display module DM is in the expansion configuration.

For the convenience of explanation, the main sidewall covers MRC, the plate PLA of the support plate MTP, and some of the support bars MSB may be omitted in FIG. 27.

In FIGS. 27 to 29, details of the same elements, e.g., the expansion module EMD, the sliding hinges SHG, the roller module RMD, the main case MCS, the moving plate MPL, and the support plate MTP, as those described with reference to FIGS. 3 to 22 will be omitted or briefly mentioned.

The embodiment will be described with reference to FIGS. 23 and 25.

Referring to FIGS. 23, 25, and 27, the moving plate MPL may move in the first direction DR1 by the expansion module EMD. In detail, in response to an external force applied to the display device DD of FIG. 1, the first-first gears GR1_1 may move in the first direction DR1 along the rails RL. The moving plate MPL extended to the first-first gears RL1_1 may move in the first direction DR1.

The first-first gears GR1_1 may be engaged with the protrusions (RPR) on the rails RL and may be rotatable with respect to the first rotational axis RX1. The first-second gears GR1_2 may be rotatable with respect to the first rotational axis RX1. In response to rotation of the first-second gears GR1_2, the second gears GR2 engaged with the first-second gears GR1_2 in the first direction DR1 may rotate with respect to the second rotational axis RX2. The second gears GR2 may rotate in a direction opposite to a direction in which the first-second gears GR1_2 rotate. In response to rotation of the second gears GR2, the first pulley parts PRY1 may rotate with respect to the second rotational axis RX2. In response to rotation of the first pulley parts PRY1, the second pulley parts PRY2 extended to the first pulley parts PRY1 may rotate with respect to the rotational axis parallel to the second direction DR2 by the belts BT.

Referring to FIG. 27, the one sides of the control units CU shown in FIG. 20A may be in contact with the second sidewall portions SPW2. The one sides of the control units CU may be disposed in the second control grooves CUG2 shown in FIG. 14. Accordingly, the expansion module EMD may be maintained in the expansion configuration.

Referring to FIGS. 27 and 28, selected support bars MSB may be exposed to the outside along the outer surface of the roller module RMD by the expansion module EMD. The area of the support plate MTP exposed to the outside may increase.

Selected support bars MSB disposed on the outer surface of the sub-rollers SRL may be disposed between the third protrusions GL3 having a gear shape. In this case, in response to rotation of the sub-rollers SRL with respect to the rotational axis parallel to the second direction DR2, the support bars MSB may be engaged with the sub-rollers SRL, and thus, the support bars MSB may move more readily.

Referring to FIGS. 27 and 29, in case that the display module DM shown in FIG. 2 is in the expansion configuration, the first hinge SHG1 and the second hinge SHG2 of one sliding hinge SHG of the sliding hinges SHG may be arranged in the second diagonal direction DDR2. The first hinge SHG1 and the second hinge SHG2 of the other sliding hinge SHG of the sliding hinges SHG may be arranged in the first diagonal direction DDR1. In case that the display module DM is in the expansion configuration, the distance between the first and second hinges SHG1 and SHG2 forming one pair may be set to a maximum value in case that the first hinge SHG1, the second hinge SHG2, and the coupling elastic member SGR are arranged in the first diagonal direction DDR1. In case that the display module DM is in the expansion configuration, the distance between the first hinges SHG1 spaced apart from each other in the second direction DR2 may be greater than the distance between the second hinges SHG2 spaced apart from each other in the second direction DR2. Although not shown in figures, the distance between the first and second hinges SHG1 and SHG2 may be set to a minimum value in case that the first hinge SHG1, the second hinge SHG2, and the coupling elastic member SGR are arranged in the second direction DR2, for example based on the display module DM moving between the contraction configuration (e.g., FIGS. 1, 5B, 12A, 23, 26) and the expansion configuration (e.g., FIGS. 2-4, 5A, 9, 12B, 27, 29).

In case that the operation configuration of the display module DM shown in FIG. 1 is changed to the expansion configuration from the contraction configuration, the sliding hinges SHG may provide the elasticity to the moving plate MPL and the main case MCS in a first movement direction that enables the moving plate MPL and the main case MCS to move away from each other.

A motor may be used to expand the display device DD. In the case where the motor is used to expand the display device DD, a battery may be required.

According to an embodiment of the disclosure, in case that an external force is applied to the display device DD, for example by a user's hand, the moving plate MPL may move and expand in the first direction DR1 in response to movement of the first gear portions GRP1 along the rails RL. In case that the first gear portions GRP1 move along the rails RL and rotate with respect to the rotational axis parallel to the second direction DR2, the second gear portions GRP2 and the roller module RMD, which are extended to the first gear portions GRP1, may rotate. Accordingly, the support plate MTP extended to the roller module RMD may be expanded along the outer surface of the roller module RMD. Accordingly, the display device may be expanded or contracted without employing the battery.

The sliding hinges SHG may be coupled to the main case MCS and the moving plate MPL, and each of the sliding hinges SHG may include the coupling elastic members SGR. Accordingly, in case that the operation configuration of the display device is changed to the expansion configuration, the sliding hinges may provide the elasticity in the first movement direction that enables the moving plate and the main case to move away from each other, and in case that the operation configuration of the display device is changed to the contraction configuration, the sliding hinges may provide the elasticity in the second movement direction that enables the moving plate and the main case to move toward each other. Accordingly, the display device may be readily expanded or contracted.

Figure 30A:
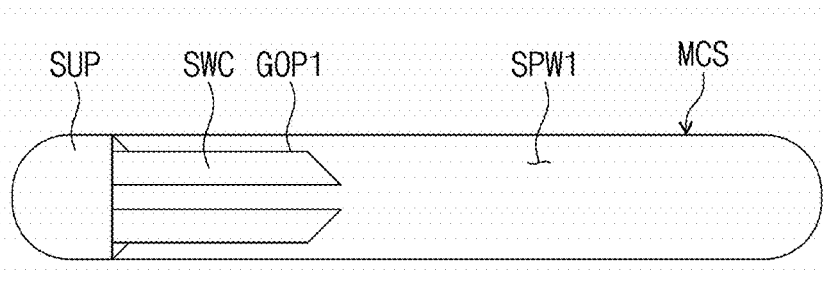
FIGS. 30A and 30B are views of the sidewall cases in the contraction configuration.
Figure 30A:
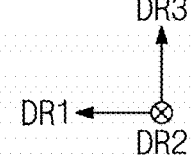
Figure 30B:
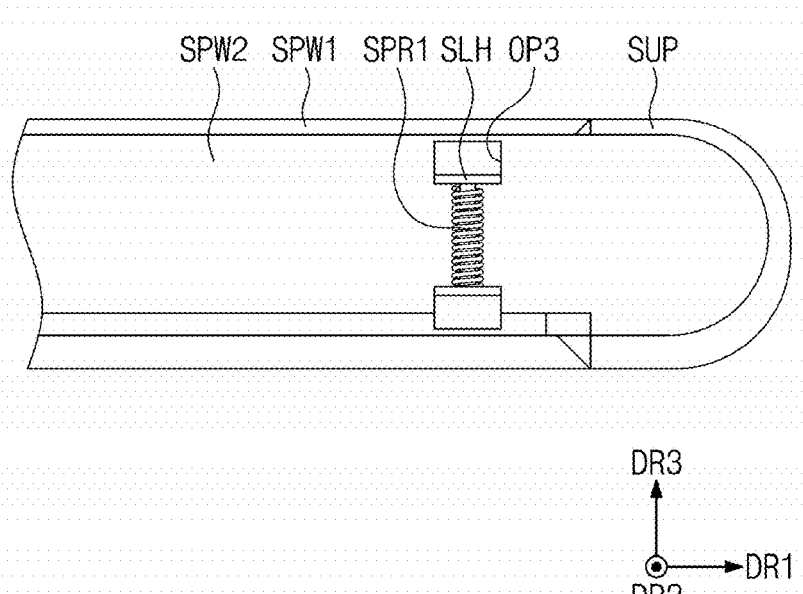
Figure 31A:
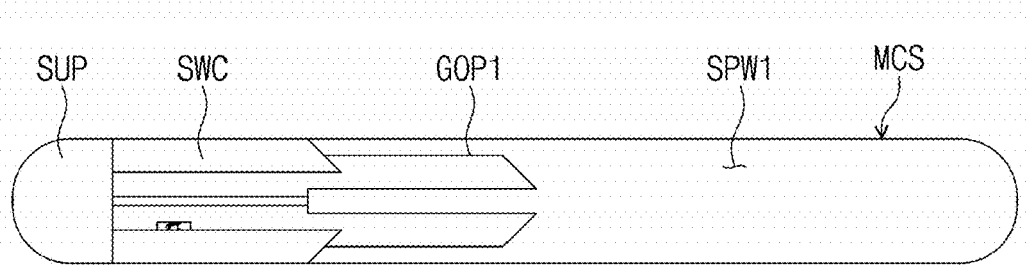
FIGS. 31A and 31B are views of the sidewall cases in the expansion configuration.
Figure 31A:
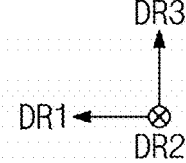
Figure 31B:
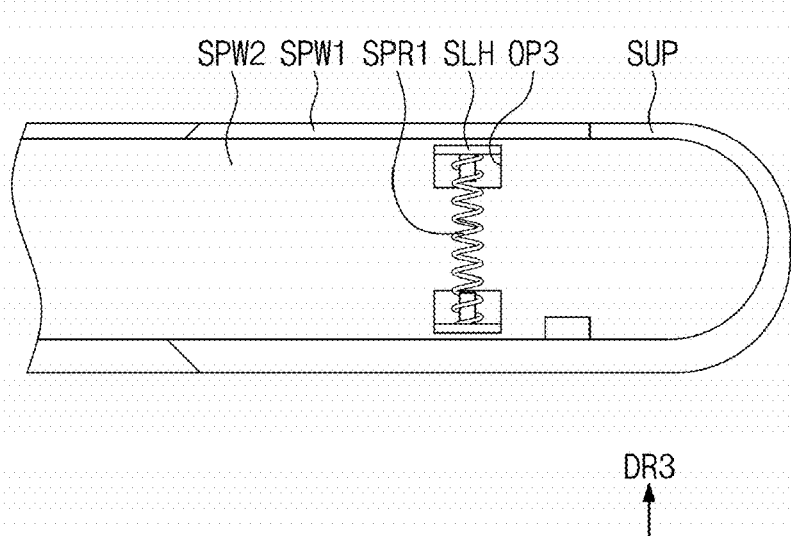

FIGS. 30A and 30B are views of the sidewall cases in the contraction configuration, and FIGS. 31A and 31B are views of the sidewall cases in the expansion configuration.

In FIGS. 30A to 31B, since configurations of the sidewall cases SWC opposite to each other in the second direction DR2 are substantially the same, descriptions are made based on one pair of the sidewall cases SWC.

For the convenience of explanation, the main sidewall covers MCR and the roller module RDM are omitted in FIGS. 30A to 31B.

In FIGS. 30A to 31B, details of the same elements, e.g., the sidewall cases SWC, the first elastic member SPR1, and the moving plate MPL, as those described with reference to FIGS. 14 to 16B and 21 will be omitted or briefly mentioned.

Referring to FIGS. 30A and 30B, the sidewall cases SWC may be disposed in the first guide openings GOP1 defined through the main case MCS. The sidewall cases SWC may be disposed between both sides of the first sidewall portion SPW1, which are opposite to each other in the third direction DR3. The sidewall protrusion portions SLH of the sidewall cases SWC may be inserted into the third openings OP3 defined through the second sidewall portion SPW2 of the moving plate MPL. The first elastic member SPR1 may be disposed between the sidewall protrusion portions SLH facing each other in the third direction DR3. In the contraction configuration, the first elastic member SPR1 may be contracted.

Referring to FIGS. 31A and 31B, in case that the operation configuration of the display device DD shown in FIGS. 1 and 2 is changed to the expansion configuration from the contraction configuration, the sidewall cases SWC may move in the first direction DR1 along the first guide openings GOP1. The sidewall cases SWC exposed to the outside through the first guide openings GOP1 may move in the third direction DR3 by the elasticity from the first elastic member SPR1. The sidewall cases SWC may be more spaced apart from each other in the third direction DR3 in case that the display device DD is in the expansion configuration than the case that the display device DD is in the contraction configuration. The upper surface of the sidewall cases SWC may be placed at the same height as the upper surface of the first sidewall portion SPW1. The sidewall cases SWC and the first sidewall portion SPW1 may be arranged in the first direction DR1. The one side of the both sides of the sidewall cases SWC, which are opposite to each other in the first direction DR1, may be in contact with the other side of the first sidewall portion SPW1. In case that the operation configuration of the display device DD is changed from the expansion configuration to the contraction configuration, the sidewall cases SWC may move in the third direction DR3 and the first direction DR1 along the other side of the first sidewall portion SPW1 and may be disposed in the first guide openings GOP1.

In a case where the sidewall cases SWC do not move in the third direction DR3 to be away from each other in case that the operation configuration of the display device DD shown in FIGS. 1 and 2 is changed to the expansion configuration, portions of the both sides, which are opposite to each other in the second direction DR2, of the display module DM shown in FIGS. 1 and 2 may be exposed to the outside. In this case, in case that the external impact is applied to the display module DM, the display module DM may be damaged.

However, according to the disclosure, in case that the operation configuration of the display device DD is changed to the expansion configuration, the sidewall cases SWC may move in the third direction DR3 by the first elastic member SPR1. Accordingly, the sidewall cases SWC may cover the portions exposed to the outside of the both sides of the display module DM, which are opposite to each other in the second direction DR2. Accordingly, although the external impact is applied to the display module DM, the display module DM may be prevented from being damaged.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a display module;
a support plate disposed under the display module and comprising a plate and a plurality of support bars arranged in a first direction with the plate;
a moving plate disposed under the plate and coupled to the support bars;
an expansion module disposed between the plate and the moving plate and movable in the first direction;
a main case disposed under the moving plate and accommodating the moving plate and the expansion module; and a sliding hinge disposed between the main case and the moving plate, the sliding hinge comprising:
a first hinge connected to the main case;
a second hinge disposed to face the first hinge and connected to the moving plate; and
a coupling elastic member disposed between the first hinge and the second hinge, wherein
the sliding hinge provides an elasticity to the moving plate and the main case in a first movement direction that enables the moving plate and the main case to move away from each other in an expansion configuration in which the display module is expanded to outside of the main case,
the sliding hinge provides the elasticity to the moving plate and the main case in a second movement direction that enables the moving plate and the main case to move toward each other in a contraction configuration in which the display module is contracted inside of the main case,
the first and second hinges and the coupling elastic member are arranged in a first diagonal direction in the contraction configuration,
the first and second hinges and the coupling elastic member are arranged in a second diagonal direction intersecting the first diagonal direction in the expansion configuration, and
the first diagonal direction intersects the first direction and a second direction intersecting the first direction on a plane defined by the first direction and the second direction.

2. The display device of claim 1, wherein
the first hinge comprises a first side rotatably coupled to the main case,
the second hinge comprises a second side disposed opposite to the first side of the first hinge and rotatably coupled to the moving plate, and
the second hinge is slidably coupled to the first hinge.

3. The display device of claim 1, wherein the coupling elastic member enables a change in a distance between the first hinge and the second hinge.

4. The display device of claim 3, wherein
the moving plate is movable away from the main case in the expansion configuration, and
the moving plate is movable toward the main case in the contraction configuration.

5. The display device of claim 1, wherein
a distance between the first hinge and the second hinge is set to a maximum value based on the first and second hinges and the coupling elastic member being arranged in the first diagonal direction or the second diagonal direction, and
the distance between the first hinge and the second hinge is set to a minimum value based on the first and second hinges and the coupling elastic member being arranged in the second direction.

6. The display device of claim 1, wherein
the main case comprises:
a first bottom portion having a plate shape defined by the first direction and a second direction intersecting the first direction, the first bottom portion comprising first and second first bottom portion sides that are opposite to each other in the second direction;
first sidewall portions extending upward from both of the first and second first bottom portion sides and comprising first guide openings and guide grooves; and
a plurality of rails disposed on the first bottom portion and extending in the first direction, the first guide openings extend from respective sides of the first sidewall portions to the first direction, and the guide grooves are disposed between the first guide openings and extend in the first direction.

7. The display device of claim 6, wherein the moving plate comprises:

a second bottom portion disposed on the first bottom portion and having a plate shape defined by the first direction and the second direction, the second bottom portion comprising first- and second-second bottom portion sides that are opposite to each other in the second direction;

second sidewall portions extending upward from both of the first- and second-second bottom portion sides; and guide protrusions disposed on outer surfaces of the second sidewall portions and extending in the first direction, the guide protrusions disposed in the guide grooves and are movable in the first direction.

8. The display device of claim 7, wherein the second bottom portion comprises rail guide grooves extending in the first direction, and the rails are disposed in the rail guide grooves and are movable in the first direction.

9. The display device of claim 7, wherein the expansion module comprises:

a first gear portion disposed on the second bottom portion, rotatable with respect to a first rotational axis parallel to the second direction, and movable in the first direction along the rails;

a second gear portion disposed on the second bottom portion, engaged with the first gear portion in the first direction, and rotating with respect to a second rotational axis parallel to the second direction; and a belt extended to the second gear portion.

10. The display device of claim 9, wherein the moving plate is movable in the first direction in response to movement of the first gear portion the first direction along the rail.

11. The display device of claim 9, further comprising:

a roller module extending in the second direction, coupled to the second sidewall portions, and rotatable with respect to a rotational axis parallel to the second direction, wherein the belt is extended to the roller module and transmits a rotational force of the second gear portion to the roller module.

12. The display device of claim 11, wherein the roller module comprises:

a main roller extending in the second direction, the main roller comprising first and second main roller sides that are opposite to each other in the second direction; and a plurality of sub-rollers disposed at both of the first and second main roller sides of the main roller, and selected support bars among the support bars are disposed on an outer surface of the roller module and an outer surface of the sub-rollers.

13. The display device of claim 12, wherein the sub-rollers have a gear shape, and the selected support bars disposed on the outer surface of the sub-rollers are disposed between protrusions of the sub-rollers having the gear shape.

14. The display device of claim 7, wherein the support bars include a coupling support bar that is farthest from the plate among the support bars, the support plate further comprises a plurality of coupling parts disposed on the coupling support bar, and the coupling parts are inserted into second guide openings defined through the second bottom portion and are slidably coupled to the moving plate in the first direction.

15. The display device of claim 6, further comprising:

a plurality of sidewall cases spaced apart from each other in the second direction and movable in the first direction relative to the main case, wherein the sidewall cases are disposed in the first guide openings.

16. The display device of claim 15, further comprising:

a first elastic member disposed between the sidewall cases that enables the sidewall cases to move away from each other or to move toward each other in a third direction intersecting the first direction and the second direction.

17. A display device comprising:

a display module;

a support plate disposed under the display module and comprising a plate and a plurality of support bars arranged in a first direction with the plate;

a moving plate disposed under the plate and coupled to the support bars;

a main case disposed under the moving plate and accommodating the moving plate; and a sliding hinge disposed between the main case and the moving plate, the sliding hinge comprising:

a first hinge connected to the main case;

a second hinge disposed to face the first hinge and connected to the moving plate; and a coupling elastic member disposed between the first hinge and the second hinge, wherein the sliding hinge provides an elasticity to the moving plate and the main case that enables the moving plate and the main case to move away from each other in response to the moving plate moving in a first movement direction away from the main case, the sliding hinge provides the elasticity to the moving plate and the main case that enables the moving plate and the main case to move toward each other in response to the moving plate moving in a second movement direction toward the main case, the first and second hinges and the coupling elastic member are arranged in a first diagonal direction in the contraction configuration, the first and second hinges and the coupling elastic member are arranged in a second diagonal direction intersecting the first diagonal direction in the expansion configuration, and the first diagonal direction intersects the first direction and a second direction intersecting the first direction on a plane defined by the first direction and the second direction.

18. The display device of claim 17, wherein a first side of the first hinge is rotatably coupled to the main case;

a second side of the second hinge is disposed opposite to the first side of the first hinge and is rotatably coupled to the moving plate; and the second hinge is slidably coupled to the first hinge.

19. An electronic device for providing an image comprising:

a display device comprising:

a display module;

a support plate disposed under the display module and comprising a plate and a plurality of support bars arranged in a first direction with the plate;

a moving plate disposed under the plate and coupled to the support bars;

an expansion module disposed between the plate and the moving plate and movable in the first direction;

a main case disposed under the moving plate and accommodating the moving plate and the expansion module; and a sliding hinge disposed between the main case and the moving plate, the sliding hinge comprising:

a first hinge connected to the main case;

a second hinge disposed to face the first hinge and connected to the moving plate; and a coupling elastic member disposed between the first hinge and the second hinge, wherein the sliding hinge provides an elasticity to the moving plate and the main case in a first movement direction that enables the moving plate and the main case to move away from each other in an expansion configuration in which the display module is expanded to outside of the main case, the sliding hinge provides the elasticity to the moving plate and the main case in a second movement direction that enables the moving plate and the main case to move toward each other in a contraction configuration in which the display module is contracted inside of the main case, the first and second hinges and the coupling elastic member are arranged in a first diagonal direction in the contraction configuration, the first and second hinges and the coupling elastic member are arranged in a second diagonal direction intersecting the first diagonal direction in the expansion configuration, and the first diagonal direction intersects the first direction and a second direction intersecting the first direction on a plane defined by the first direction and the second direction.

\* \* \* \* \*